(12) United States Patent  (10) Patent No.: US 9,350,228 B2
Uetake et al.  (45) Date of Patent: May 24, 2016

(54) POWER CONVERSION APPARATUS

(75) Inventors: Masahiro Uetake, Hitachinaka (JP);
Kenji Ohshima, Hitachinaka (JP)

(73) Assignee: Hitachi Automotive Systems, Ltd.,
Hitachinaka-shi (JP)

( * ) Notice: Subject to any disclaimer, the term of this patent is extended or adjusted under 35 U.S.C. 154(b) by 229 days.

(21) Appl. No.: 14/235,258

(22) PCT Filed: Jul. 25, 2012

(86) PCT No.: PCT/JP2012/068848
§ 371 (c)(1),
(2), (4) Date: Jan. 27, 2014

(87) PCT Pub. No.: WO2013/018620
PCT Pub. Date: Feb. 7, 2013

(65) Prior Publication Data
US 2014/0160823 A1  Jun. 12, 2014

(30) Foreign Application Priority Data
Jul. 29, 2011 (JP) .................................. 2011-166987

(51) Int. Cl.
*H05K 7/02* (2006.01)
*H05K 7/20* (2006.01)
*H02M 1/14* (2006.01)
*H02M 7/00* (2006.01)
(Continued)

(52) U.S. Cl.
CPC *H02M 1/14* (2013.01); *H02M 1/00* (2013.01); *H02M 1/44* (2013.01); *H02M 7/003* (2013.01); *H05K 7/1432* (2013.01); *H05K 7/20927* (2013.01)

(58) Field of Classification Search
CPC .......................... H05K 7/1432; H05K 7/20927
See application file for complete search history.

(56) References Cited

U.S. PATENT DOCUMENTS 6,021,040 A  2/2000 Suzuki et al.
7,561,429 B2  7/2009 Yahata et al.
(Continued)

FOREIGN PATENT DOCUMENTS

EP  2 101 402 A2  9/2009
EP  2 323 469 A1  5/2011
(Continued)

OTHER PUBLICATIONS

Extended European Search Report dated Mar. 19, 2015 (nine (9) pages).

(Continued)

*Primary Examiner* — Robert J Hoffberg
(74) *Attorney, Agent, or Firm* — Crowell & Moring LLP

(57) ABSTRACT

A power conversion device includes a capacitor for smoothing DC current; power semiconductor modules having power semiconductor devices stored in a module case and DC terminals, an AC terminal and signal terminals are extracted from an extracting part of the module case; a capacitor bus bar that connects the capacitor with the DC terminals; a first channel body having a first coolant channel formed to allow the power semiconductor modules to be inserted therein; a second channel body in which a second coolant channel for cooling the capacitor and the capacitor bus bar is formed; and a housing having a base on which the first and second channel bodies are arranged in parallel across a prescribed space and openings formed in areas of the base facing the prescribed space.

7 Claims, 34 Drawing Sheets

(51) Int. Cl.
*H05K 7/14* (2006.01)
*H02M 1/00* (2006.01)
*H02M 1/44* (2007.01)

(56) References Cited

U.S. PATENT DOCUMENTS

| | | | |
|---|---|---|---|
| 8,169,780 B2 | 5/2012 | Yoshino et al. | |
| 9,007,767 B2* | 4/2015 | Nakajima | H02M 7/003 165/80.4 |
| 9,042,147 B2* | 5/2015 | Ishii | H02M 1/12 361/677 |
| 9,054,628 B2* | 6/2015 | Numakura | B60L 3/003 |
| 2009/0231811 A1 | 9/2009 | Tokuyama et al. | |
| 2011/0116235 A1 | 5/2011 | Ryu et al. | |
| 2011/0249421 A1 | 10/2011 | Matsuo et al. | |
| 2011/0299265 A1 | 12/2011 | Nakatsu et al. | |
| 2011/0310585 A1 | 12/2011 | Suwa et al. | |
| 2013/0094269 A1* | 4/2013 | Maeda | H02M 7/003 363/141 |
| 2013/0114210 A1 | 5/2013 | Ebersberger et al. | |
| 2013/0223009 A1* | 8/2013 | Nakatsu | H02M 7/003 361/699 |
| 2013/0279114 A1* | 10/2013 | Nishikimi | B60K 6/28 361/699 |
| 2014/0078803 A1* | 3/2014 | Nishihara | H02M 7/003 363/141 |
| 2014/0098588 A1* | 4/2014 | Kaneko | H02M 7/003 363/141 |
| 2014/0126154 A1* | 5/2014 | Higuchi | B60L 11/1803 361/714 |
| 2014/0313806 A1* | 10/2014 | Shinohara | H05K 7/20927 363/141 |

FOREIGN PATENT DOCUMENTS

| | | |
|---|---|---|
| EP | 2 346 152 A1 | 7/2011 |
| JP | 11-274001 A | 10/1999 |
| JP | 2002-78356 A | 3/2002 |
| JP | 2004-104860 A | 4/2004 |
| JP | 2006-269933 A | 10/2006 |
| JP | 2007-043204 A | 2/2007 |
| JP | 2008-125240 A | 5/2008 |
| JP | 2010-110143 A | 5/2010 |
| JP | 2010-135093 A | 6/2010 |
| JP | 2010-213447 A | 9/2010 |
| JP | 2011-004522 A | 1/2011 |
| JP | 2012-005322 A | 1/2012 |
| JP | 2012-104822 A | 5/2012 |

OTHER PUBLICATIONS

International Search Report (PCT/ISA/210) with English translation dated Nov. 6, 2012 (Five (5) pages).

* cited by examiner

POWER CONVERSION APPARATUS

TECHNICAL FIELD

The present invention relates to a power conversion device which is installed in an electric vehicle (EV), a hybrid electric vehicle (HEV), etc.

BACKGROUND ART

Electric vehicles (EVs) and hybrid electric vehicles (HEVs) are equipped with a power conversion device for driving the traveling rotary electric machine (rotary electric machine for the traveling of the vehicle) with the electric power of the battery. In the field of the power conversion devices for electric vehicles or hybrid electric vehicles, there is a strong demand for the downsizing of the device from the viewpoint of securing a large space for the driver and passengers, etc.

The wires for supplying the electric power from the power conversion device to the motor are desired to be as short as possible, and thus it is preferable to arrange the power conversion device in the vicinity of the motor. For example, the power conversion device is arranged over or under the motor in many cases. In such arrangements, the height dimension of the power conversion device is required to be as small as possible since it is impossible to secure a large device arrangement space in the vertical direction.

As a method for reducing the arrangement space of the power conversion device, it is possible to downsize the power conversion device by mounting the power module and the capacitor on the periphery of the motor stator (electromechanical integration type) as described in Patent Literature 1, for example.

PRIOR ART LITERATURE

Patent Literature

Patent Literature 1: JP-2010-213447-A

SUMMARY OF THE INVENTION

Problem to be Solved by the Invention

However, the above integrated configuration, mounting the power module and the capacitor on the motor stator, has drawbacks such as the need of preparing the design for each motor type and low degree of freedom of layout change.

It is therefore the primary object of the present invention to reduce the height dimension of power conversion devices that are not of the electromechanical integration type.

Means for Solving the Problem

According to an aspect of the present invention, there is provided a power conversion device comprising: a capacitor which smoothes DC current; power semiconductor modules in each of which power semiconductor devices for converting the DC current into AC current are stored in a module case in a bottomed tubular shape and DC terminals, an AC terminal and signal terminals are extracted from an extracting part of the module case; a capacitor bus bar which connects the capacitor with the DC terminals; a first channel body in which a first coolant channel is formed to allow the power semiconductor modules to be inserted therein; a second channel body in which a second coolant channel for cooling the capacitor and the capacitor bus bar is formed; and a housing having a base on which the first and second channel bodies are arranged in parallel across a prescribed space and openings formed in areas of the base facing the prescribed space. The power semiconductor modules are inserted into the first coolant channel so that the extracting parts of the module cases are arranged at the face of the second channel body facing the prescribed space. The capacitor bus bar is extracted from the second channel body to the prescribed space. The DC terminals are connected with the capacitor bus bar at positions facing the openings.

Effect of the Invention

According to the present invention, a power conversion device excelling in the cooling performance while also being low-profile (small in the height dimension) can be provided.

MODE FOR CARRYING OUT THE INVENTION

Figure 1:
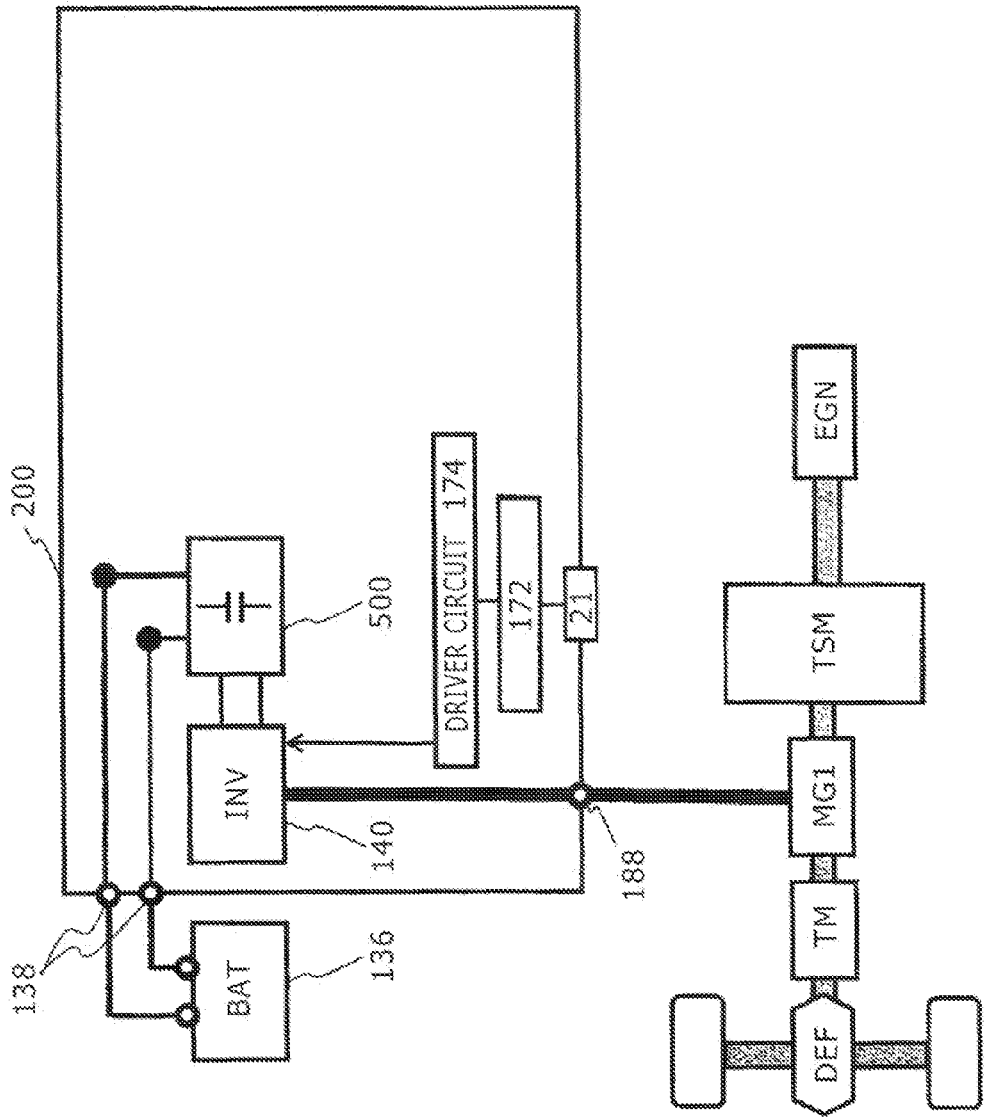
FIG. 1 is a block diagram showing control blocks of a hybrid electric vehicle which is equipped with a power conversion device in accordance with an embodiment of the present invention.

An embodiment for carrying out the present invention will be described below with reference to figures. FIG. 1 is a block diagram showing control blocks of a hybrid electric vehicle (hereinafter referred to as an "HEV"). The power conversion device in accordance with this embodiment is applicable not only to those installed in HEVs but also to those installed in PHEVs, EVs, etc. The power conversion device of this embodiment is applicable also to those installed in other types of vehicles such as construction machines.

An engine EGN and a motor generator MG1 generate torque for the traveling of the vehicle. The motor generator MG1 has not only the function of generating the rotary torque but also a function of converting mechanical energy (applied to the motor generator MG1 from the outside) into electric power. The motor generator MG1 (implemented by a synchronous machine or an induction machine, for example) operates either as a motor or as a generator depending on the operation mode as mentioned above. In cases where the motor generator MG1 is installed in a vehicle, the motor generator MG1 is required to generate high power with a small size, and thus a permanent magnet-type synchronous motor employing neodymium magnets or the like is suitable as the motor generator MG1. The permanent magnet-type synchronous motors, in which the heating of the rotor is less than that in induction motors, are suitable for the use for vehicles also from this viewpoint.

The output torque on the output side of the engine EGN is transmitted to the motor generator MG1 via a power transfer mechanism TSM. The rotary torque from the power transfer mechanism TSM or the rotary torque generated by the motor generator MG1 is transmitted to the wheels via a transmission TM and a differential gear DEF. In contrast, during the operation of regenerative braking, rotary torque is transmitted from the wheels to the motor generator MG1. The motor generator MG1 generates AC power according to the supplied rotary torque. The generated AC power is converted by a power conversion device 200 (explained below) into DC power. The DC power charges a high-voltage battery 136. The electric power stored in the battery 136 is reused as energy for the traveling of the vehicle.

Next, the power conversion device 200 will be explained below. An inverter circuit 140 installed in the power conversion device 200 is electrically connected to the battery 136 via DC connectors 138. Electric power is communicated between the battery 136 and the inverter circuit 140. When the motor generator MG1 is operated as a motor, the inverter circuit 140 generates AC power according to DC power supplied from the battery 136 via the DC connectors 138 and supplies the generated AC power to the motor generator MG1 via an AC terminal 188. The configuration made up of the motor generator MG1 and the inverter circuit 140 operates as a motor/generator unit.

Incidentally, it is possible in this embodiment to drive the vehicle with the power of the motor generator MG1 alone, by operating the motor/generator unit as a motor unit by use of the electric power of the battery 136. Further, it is possible in this embodiment to charge the battery 136 by operating the motor/generator unit as a generator unit (generating electric power) by use of the power of the engine EGN or the power from the wheels.

Although illustration is omitted in FIG. 1, the battery 136 is used also as a power supply for driving a motor for auxiliary machinery. The motor for the auxiliary machinery can be, for example, a motor for driving the compressor of the air conditioner or a motor for driving a hydraulic pump used for control. DC power is supplied from the battery 136 to an auxiliary machinery power module. The auxiliary machinery power module generates AC power and supplies the generated AC power to the motor for the auxiliary machinery. The auxiliary machinery power module has basically the same circuitry and functions as the inverter circuit 140 and controls the phase, frequency and electric power of the AC power supplied to the motor for the auxiliary machinery. The power conversion device 200 is equipped with a capacitor 500 for smoothing the DC power supplied to the inverter circuit 140.

The power conversion device 200 has a communication connector 21 for receiving commands from an upper-level control device, transmitting data representing status to the upper-level control device, and so forth. Based on the commands inputted through the connector 21, the power conversion device 200 makes its control circuit 172 calculate control values for the motor generator MG1 and calculate (determine) whether the motor generator MG1 should be operated as a motor or as a generator. Based on the result of the calculation, the power conversion device 200 generates a control pulse and supplies the generated control pulse to a driver circuit 174. According to the supplied control pulse, the driver circuit 174 generates drive pulses for controlling the inverter circuit 140.

Figure 2:
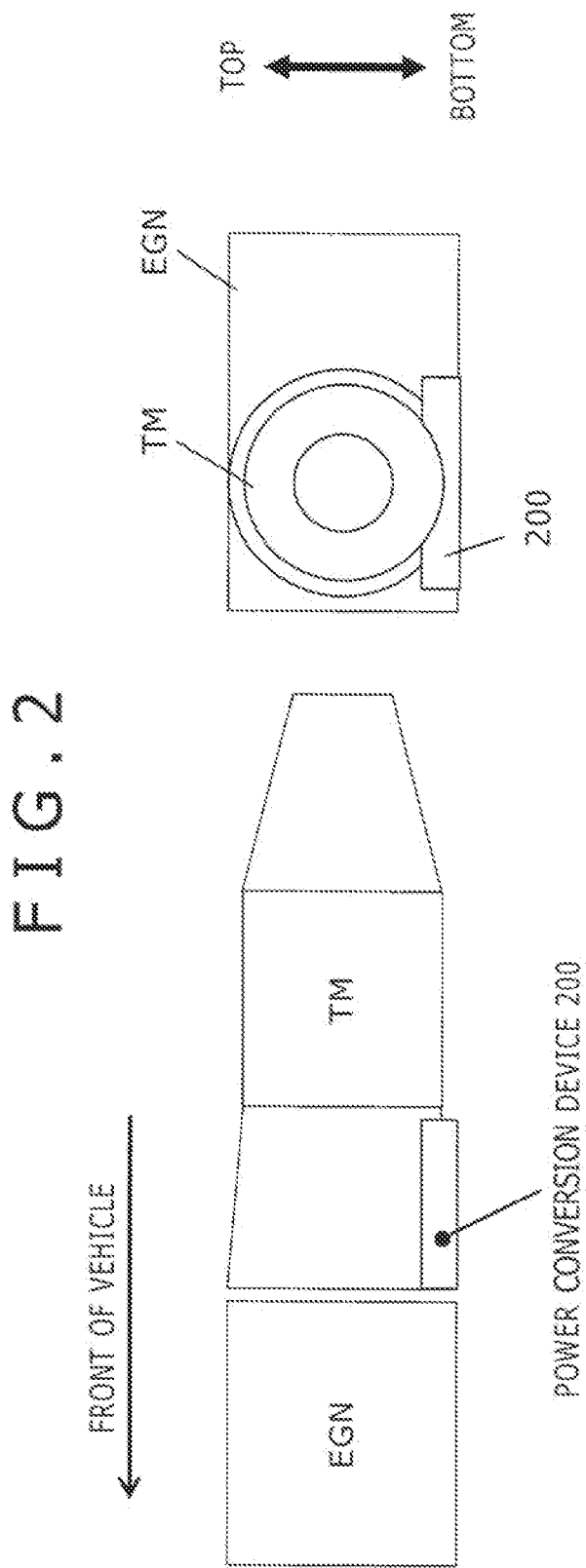
FIG. 2 is a schematic diagram showing the position of arrangement of the power conversion device 200 in the vehicle.

FIG. 2 schematically shows the position of arrangement of the power conversion device 200 in the vehicle. The engine EGN and the transmission TM are arranged in this order from the front of the vehicle. The power conversion device 200 is arranged under the transmission TM. The motor generator MG1 is arranged in a front part of the case of the transmission TM (i.e., arranged over the power conversion device 200). The space for the arrangement of the power conversion device 200 is desired to be as small as possible from the viewpoint of space saving.

Further, wires for supplying the electric power from the power conversion device 200 to the motor generator MG1 are desired to be as short as possible, and thus it is preferable to arrange the power conversion device 200 in the vicinity of the motor generator MG1. For this reason, the power conversion device 200 is in many cases arranged in a small space such as the space under the transmission TM shown in FIG. 2 and the downsizing/low-profiling of the power conversion device 200 is being requested. Incidentally, the arrangement shown in FIG. 2 is just an example for illustration; the power conversion device 200 can be arranged on the engine's side of the inside of the case of the transmission TM or installed in the bell housing.

Figure 3:
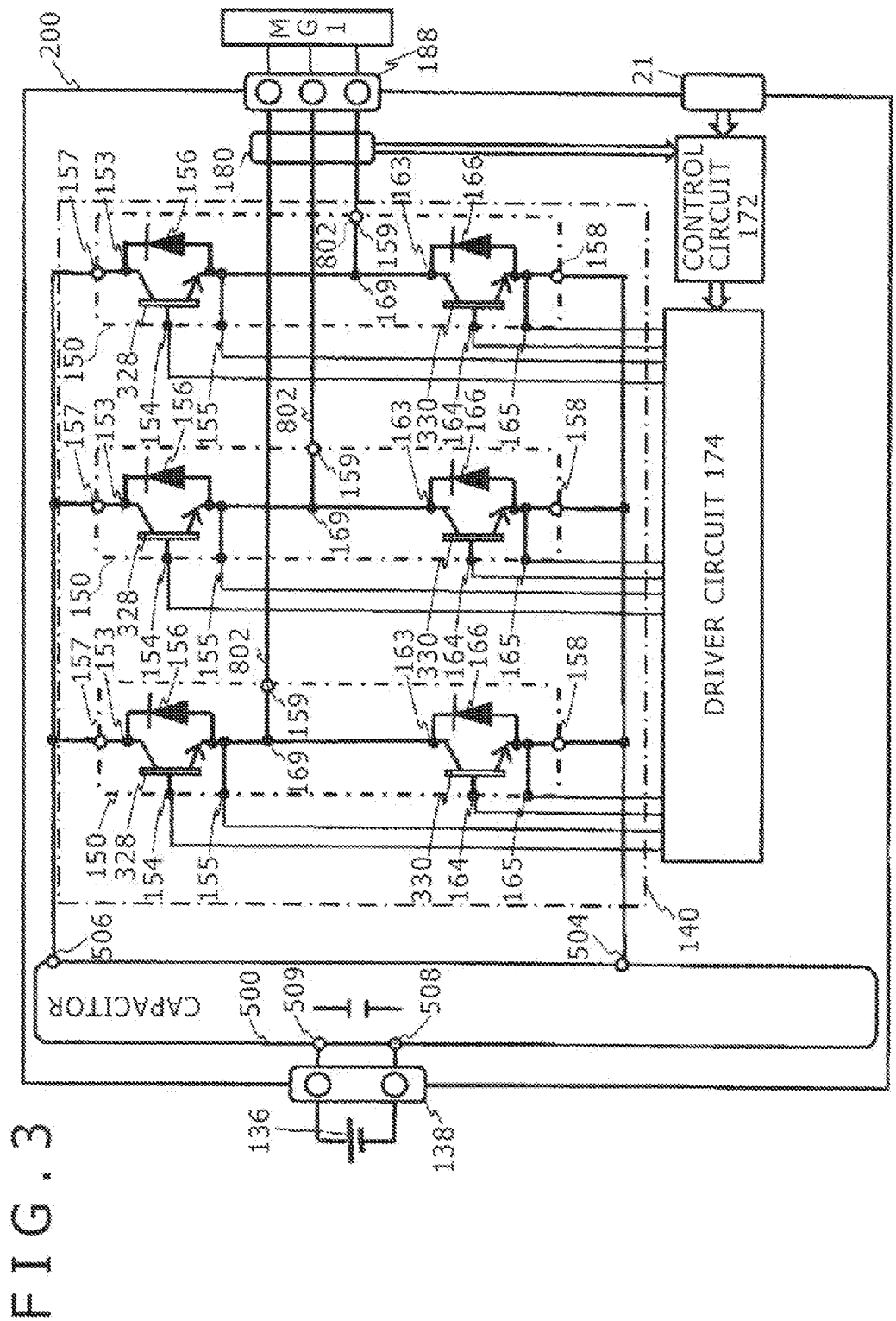
FIG. 3 is a schematic diagram for explaining the electric circuit configuration of an inverter circuit 140.

Next, the electric circuit configuration of the inverter circuit 140 will be explained below referring to FIG. 3. In the following explanation, semiconductor devices are implemented by insulated gate bipolar transistors, which will be abbreviated as "IGBTs". A series circuit 150 of upper and lower arms is formed by an IGBT 328 and a diode 156 operating as the upper arm and an IGBT 330 and a diode 166 operating as the lower arm. The inverter circuit 140 is equipped with three of the series circuits 150 corresponding to the U-phase, V-phase and W-phase of the AC power to be outputted.

These three phases correspond to the three-phase armature windings (U-phase, V-phase, W-phase) of the motor generator MG1 in this embodiment. In the upper/lower arm series circuit 150 for each of the three phases, an intermediate electrode 169 as the midpoint of the series circuit is connected to the motor generator MG1 via an AC terminal 159, an AC bus bar 802 and the AC terminal 188. The AC current from the series circuit 150 is outputted from the intermediate electrode 169 to the motor generator MG1 via the path described above.

The collector electrode 153 of the upper arm IGBT 328 is electrically connected to a positive capacitor terminal 506 of the capacitor 500 via a positive DC terminal 157. Meanwhile, the emitter electrode of lower arm IGBT 330 is electrically connected to a negative capacitor terminal 504 of the capacitor 500 via a negative DC terminal 158.

As mentioned above, the control circuit 172 receives a control command from the upper-level control device via the connector 21, generates the control pulse (as a control signal for controlling the IGBTs 328 and the IGBTs 330 constituting the upper and lower arms of the three-phase series circuits 150 of the inverter circuit 140) based on the control command, and supplies the generated control pulse to the driver circuit 174.

According to the control pulse, the driver circuit 174 supplies the drive pulses to the IGBTs 328 and the IGBTs 330 constituting the upper and lower arms of the three-phase series circuits 150. The IGBTs 328 and 330 perform the conduction/interruption operation according to the drive pulses from the driver circuit 174 and thereby convert the DC power supplied from the battery 136 into three-phase AC power. The three-phase AC power obtained by the conversion is supplied to the motor generator MG1.

The IGBT 328 has the collector electrode 153, an emitter electrode 155 for signaling, and a gate electrode 154. Meanwhile, the IGBT 330 has a collector electrode 163, an emitter electrode 165 for signaling, and a gate electrode 164. The diode 156 is electrically connected between the collector electrode 153 and the emitter electrode 155. Meanwhile, the diode 166 is electrically connected between the collector electrode 163 and the emitter electrode 165.

The switching power semiconductor devices may also be implemented by use of metal-oxide-semiconductor field-effect transistors (hereinafter abbreviated as "MOSFETs"). In this case, the diodes 156 and the diodes 166 are unnecessary. In the use as the switching power semiconductor devices, IGBTs are suitable for cases where the DC voltage is relatively high, while MOSFETs are suitable for cases where the DC voltage is relatively low.

The capacitor 500 is equipped with the positive capacitor terminal 506, the negative capacitor terminal 504, a positive power supply terminal 509 and a negative power supply terminal 508. The high-voltage DC power from the battery 136 is supplied to the power supply terminals 509 and 508 via the DC connectors 138 and then supplied to the inverter circuit 140 via the capacitor terminals 506 and 504 of the capacitor 500.

On the other hand, the DC power obtained by the inverter circuit 140 by the conversion of the AC power is supplied to the capacitor 500 via the capacitor terminals 506 and 504. The DC power is thereafter supplied from the power supply terminals 509 and 508 to the battery 136 via the DC connectors 138 and is stored in the battery 136.

The control circuit 172 includes a microcomputer for calculating the switching timing of the IGBTs 328 and the IGBTs 330. Information inputted to the microcomputer includes a target torque value which is required of the motor generator MG1, values of electric currents supplied from the series circuits 150 to the motor generator MG1, and the magnetic pole position of the rotor of the motor generator MG1.

The target torque value is a value based on a command signal supplied from the unshown upper-level control device. The electric current values are detected based on detection signals from a current sensor module 180. The magnetic pole position is detected based on a detection signal from a rotary magnetic pole sensor (unshown) such as a resolver installed in the motor generator MG1. While an example in which the current sensor module 180 detects the electric current values of the three phases is described in this embodiment, it is also possible to make the electric current sensor 180 detect electric current values of two phases and then determine the electric currents of the three phases by calculation.

The microcomputer in the control circuit 172 calculates d-axis and q-axis current command values for the motor generator MG1 based on the target torque value, calculates d-axis and q-axis voltage command values based on the differences between the calculated d-axis and q-axis current command values and detected d-axis and q-axis current values, and converts the calculated d-axis and q-axis voltage command values into U-phase, V-phase and W-phase voltage command values based on the detected magnetic pole position. Then, the microcomputer generates pulse-like modulation waves based on comparison between a carrier wave (triangular wave) and fundamental waves (sinusoidal waves) based on the U-phase, V-phase and W-phase voltage command values, and outputs the generated modulation waves to the driver circuit 174 as PWM (pulse-width modulation) signals.

For driving the lower arm, the driver circuit 174 amplifies each PWM signal and outputs the amplified PWM signal to the gate electrode of each corresponding lower arm IGBT 330 as a drive signal. For driving the upper arm, the driver circuit 174 amplifies each PWM signal after shifting the reference electric potential level of the PWM signal to that of the upper arm, and outputs the amplified PWM signal to the gate electrode of each corresponding upper arm IGBT 328 as a drive signal.

Further, the microcomputer in the control circuit 172 protects the series circuits 150 by detecting abnormalities (overcurrent, overvoltage, overtemperature, etc.). For the abnormality detection, sensing information is inputted to the control circuit 172. For example, information on the electric current passing through the emitter electrode of each IGBT 328/330 is inputted to a corresponding drive unit (IC) from the signaling emitter electrode 155/165 of each arm. Based on the inputted sensing information, each drive unit (IC) detects overcurrent and protects the corresponding IGBT 328/330 from overcurrent by stopping the switching operation of the corresponding IGBT 328/330 when overcurrent is detected.

Information on the temperature of each series circuit 150 is inputted to the microcomputer from a temperature sensor (unshown) installed in the series circuit 150. Further, information on the voltage on the DC positive side of each series circuit 150 is inputted to the microcomputer. The microcomputer detects overtemperature and overvoltage based on the input information and stops the switching operation of all the IGBTs 328 and 330 when overtemperature or overvoltage is detected.

Figure 4:
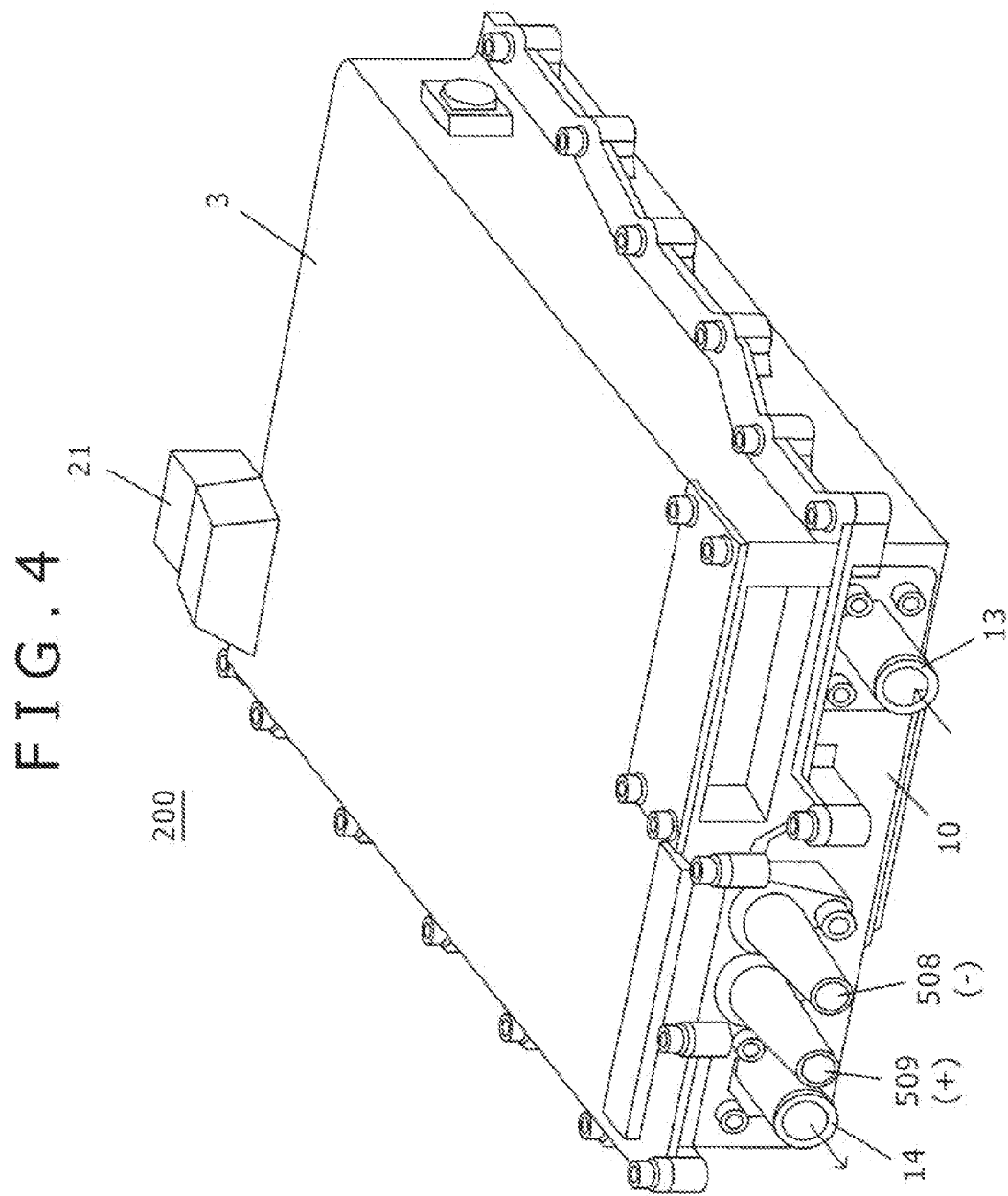
FIG. 4 is an external perspective view of the power conversion device 200.

FIG. 4 is an external perspective view of the power conversion device 200. In order to adapt to the arrangement shown in FIG. 2, the power conversion device 200 of this embodiment is designed so as to reduce the height dimension of the entire power conversion device 200 by employing a configuration described below. The housing 10 of the power conversion device 200 is a metallic housing substantially in a rectangular shape in the plan view. A side face of the housing 10 is provided with a pipe 13 for supplying a cooling medium (e.g., cooling water, hereinafter referred to as "coolant") to the inside of the housing and a pipe 14 for discharging the coolant. The reference characters 508 and 509 represent the power supply terminals for DC input. The connector 21 is a signaling connector provided for the connection with the outside (e.g., the upper-level control device).

Figure 5:
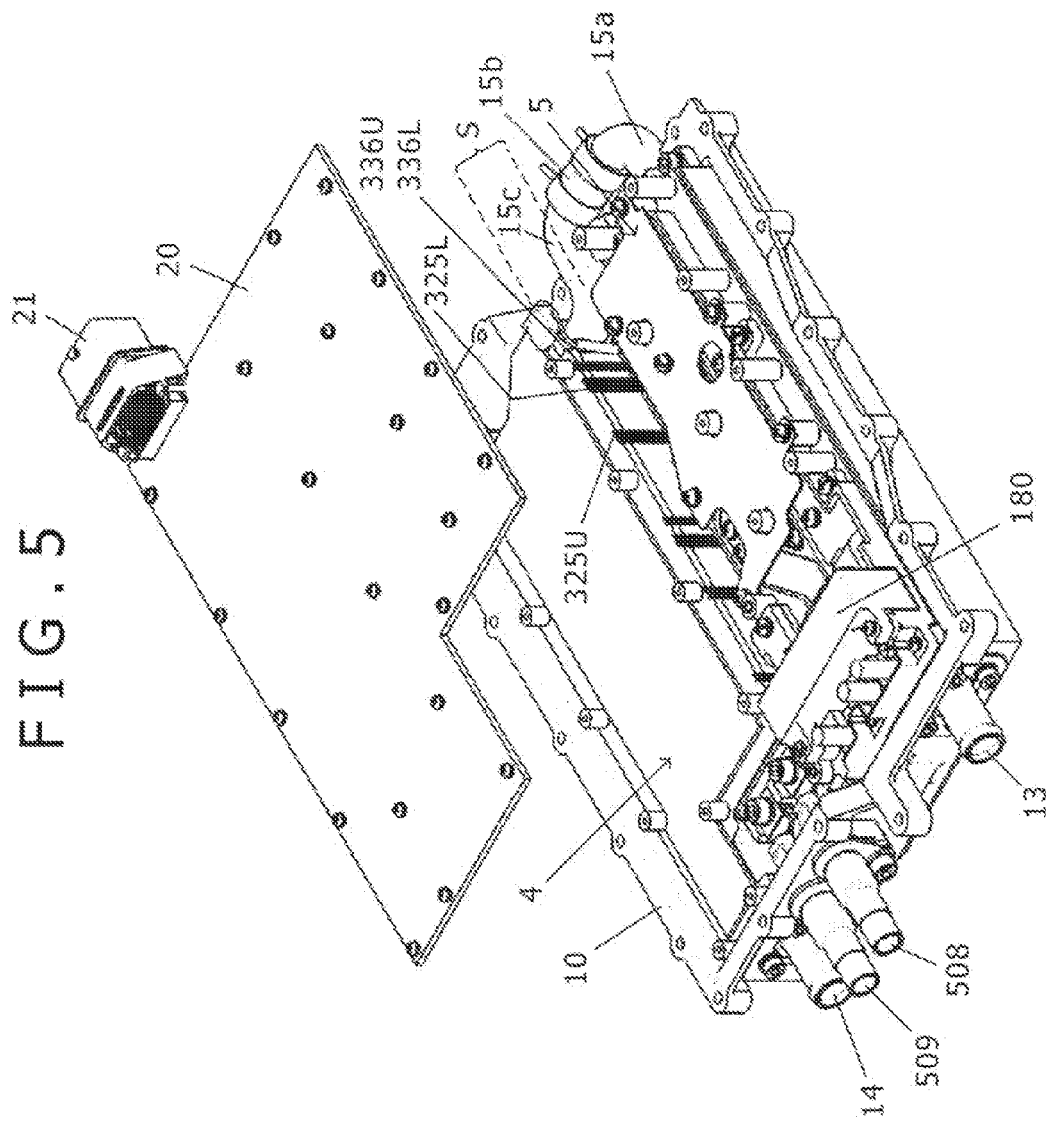
FIG. 5 is an exploded perspective view of the power conversion device 200.

FIG. 5 is an exploded perspective view of the power conversion device 200. In FIG. 5, illustration of an upper cover 3 is omitted. In a left-hand part inside the housing 10 shown in FIG. 5, a capacitor unit 4 storing the capacitor 500 is arranged along the length of the housing 10. In a right-hand part inside the housing 10 shown in FIG. 5, a power module unit 5 including the inverter circuit 140 shown in FIG. 2 is arranged in parallel with the capacitor unit 4. A circuit board 20 to which the connector 21 has been attached is arranged over the capacitor unit 4 and the power module unit 5. The control circuit 172 and the driver circuit 174 shown in FIG. 3 have been mounted on the circuit board 20. The upper cover 3 is fixed by using bolts so as to cover the opening part of the housing 10.

(Explanation of Power Module Unit 5)

Figure 6:
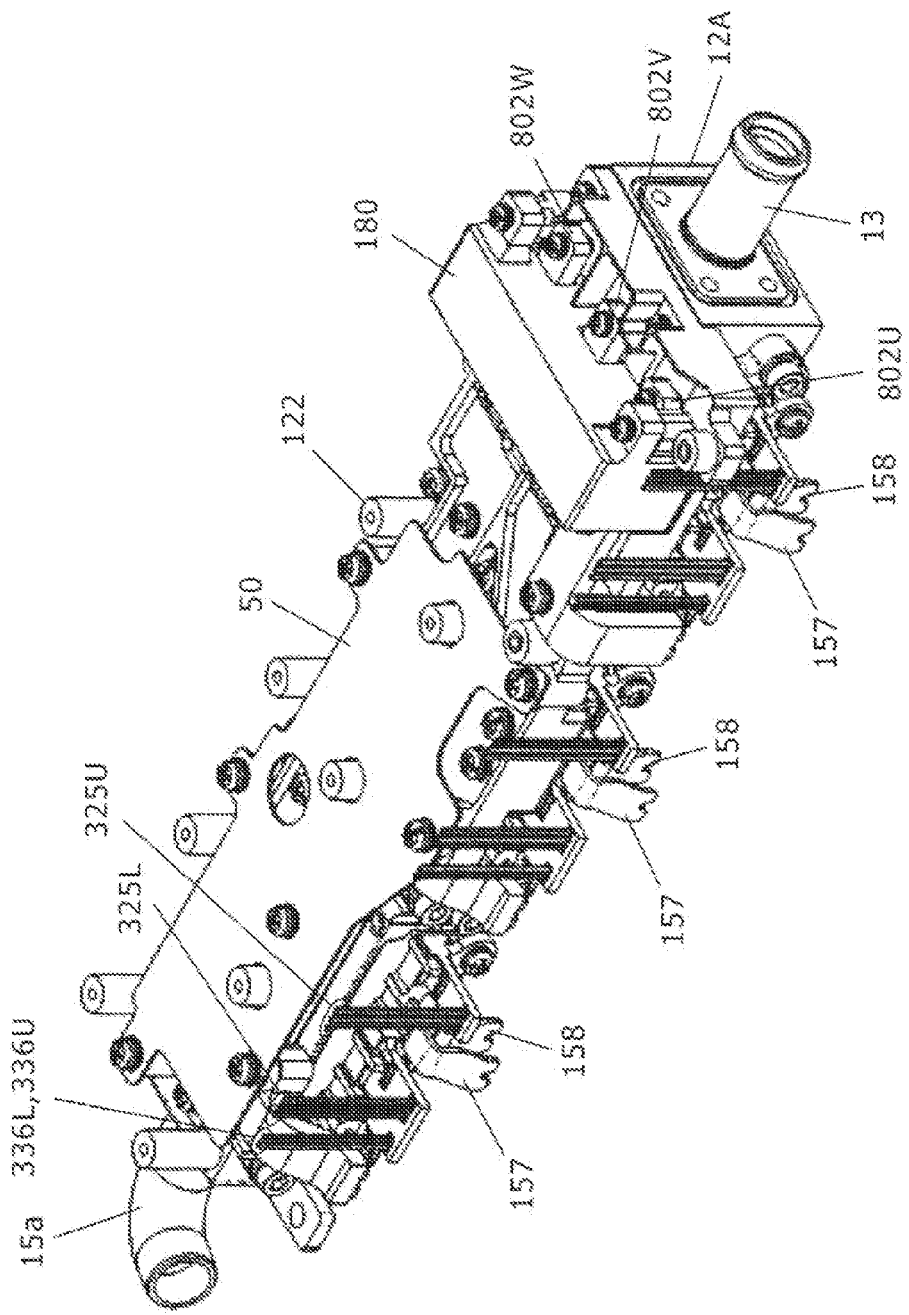
FIG. 6 is a perspective view of a power module unit 5.
Figure 7:
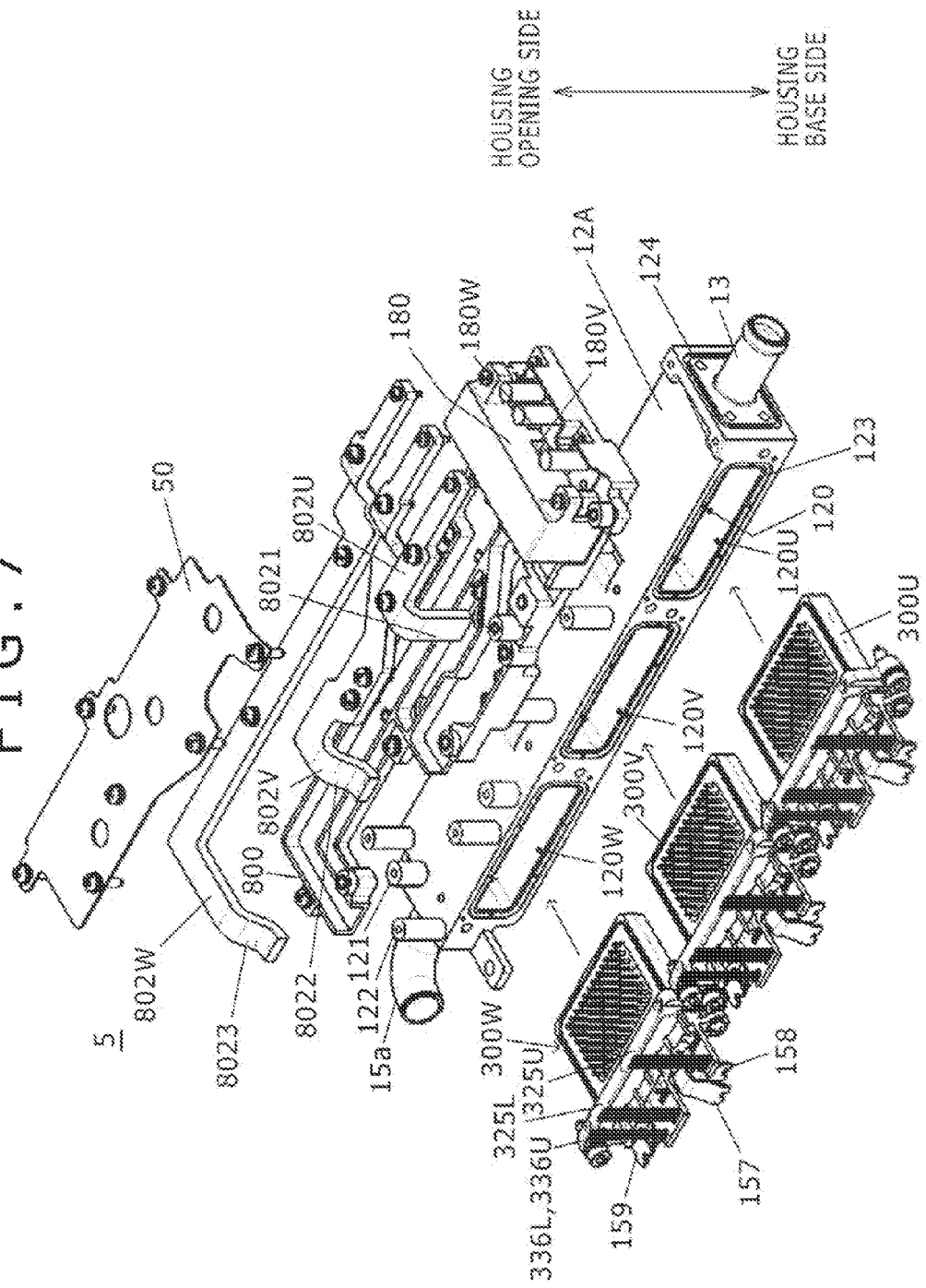
FIG. 7 is an exploded perspective view of the power module unit 5.

FIGS. 6 and 7 are schematic diagrams showing the power module unit 5, wherein FIG. 6 is a perspective view and FIG. 7 is an exploded perspective view. The power module unit 5 includes a coolant channel body 12A (as a casing in which a coolant channel has been formed), a bus bar holder 800, AC bus bars 802U, 802V and 802W, a shielding plate 50, the current sensor module 180, and power semiconductor modules 300U, 300V and 300W. The coolant channel body 12A, which includes the coolant channel for the circulation of the coolant as explained later, functions as a cooler for cooling down the components mounted on the coolant channel body 12A.

The coolant channel body 12A is a casing formed of metal (e.g. aluminum) in a rectangular shape. An end of the coolant channel body 12A in its lengthwise direction is provided with the pipe 13 for allowing the coolant to flow into the coolant channel body 12A. The opposite end face of the coolant channel body 12A is provided with a pipe 15a for discharging the coolant. A coolant channel 120 for the circulation of the coolant is formed in the coolant channel body 12A. Openings 120U, 120V and 120W to be used for inserting the power semiconductor modules 300U, 300V and 300W into the coolant channel 120 have been formed through a side face of the coolant channel body 12A. When the power semiconductor modules 300U, 300V and 300W are inserted into the corresponding openings 120U, 120V and 120W and fixed to the coolant channel body 12A, the openings 120U, 120V and 120W are sealed up. A seal member 123 for the sealing is arranged around each of the openings 120U-120W.

The bus bar holder 800 is formed of insulating material (e.g., insulating resin). Attachment grooves to be used for attaching the AC bus bars 802 to the bus bar holder 800 are formed in the upper part of the illustrated bus bar holder 800 (close to the opening of the housing 10). In FIGS. 6 and 7, the AC bus bars corresponding to the U-phase, V-phase and W-phase are indicated with the reference characters 802U, 802V and 802W (ditto for subsequent figures). The AC bus bars 802U-802W are set at prescribed positions by fitting them into corresponding attachment grooves of the bus bar holder 800. Then, the AC bus bars 802U-802W are fixed to the bus bar holder 800 by using screws. Connecting portions 8021, 8022 and 8023 of the AC bus bars 802U, 802V and 802W to be connected to the power semiconductor modules 300U, 300V and 300W are bent downward in FIG. 7 (toward the base of the housing 10).

The current sensor module 180 is fixed to the bus bar holder 800. Through holes 180U, 180V and 180W corresponding to the AC bus bars 802U, 802V and 802W are formed through the current sensor module 180. Incidentally, the through hole 180U cannot be seen in FIG. 7. The AC bus bars 802U, 802V and 802W are fixed so that their output ends penetrate the corresponding through holes 180U, 180V and 180W, respectively. The current sensor module 180 is equipped with current sensors (e.g., current sensors employing Hall sensors) corresponding to the through holes 180U, 180V and 180W. The currents flowing through the AC bus bars 802U, 802V and 802W are detected by the current sensors, respectively.

The bus bar holder 800 to which the AC bus bars 802U-802W and the current sensor module 180 have been attached is mounted and screwed onto the upper face of the coolant channel body 12A. Thereafter, the shielding plate 50 is screwed on the bus bar holder 800 and on short pillars 121 formed on the upper surface of the coolant channel body 12A. The shielding plate 50 is arranged to cover the tops of the AC bus bars 802U-802W (see FIG. 6) and is electrically connected to a grounding part of the vehicle via the pillars 121, the coolant channel body 12A and the housing 10. Besides the pillars 121, long pillars 122 for fixing the circuit board 20 (see FIG. 5) by using screws are formed on the upper surface of the coolant channel body 12A. The pillars 122 protrude upward from the shielding plate 50 as shown in FIG. 6.

(Explanation of Power Semiconductor Modules 300U-300W)

Details of the power semiconductor modules 300U-300W will be explained below referring to FIGS. 8-13. As shown in FIG. 2, the inverter circuit 140 is equipped with the series circuits 150 regarding the U-phase, V-phase and W-phase. The power semiconductor module 300U is equipped with the U-phase series circuit 150. The power semiconductor module 300V is equipped with the V-phase series circuit 150. The power semiconductor module 300W is equipped with the W-phase series circuit 150. The three power semiconductor modules 300U-300W are configured in the same way, and thus the following explanation will be given by taking the power semiconductor module 300U as an example.

Figure 8:
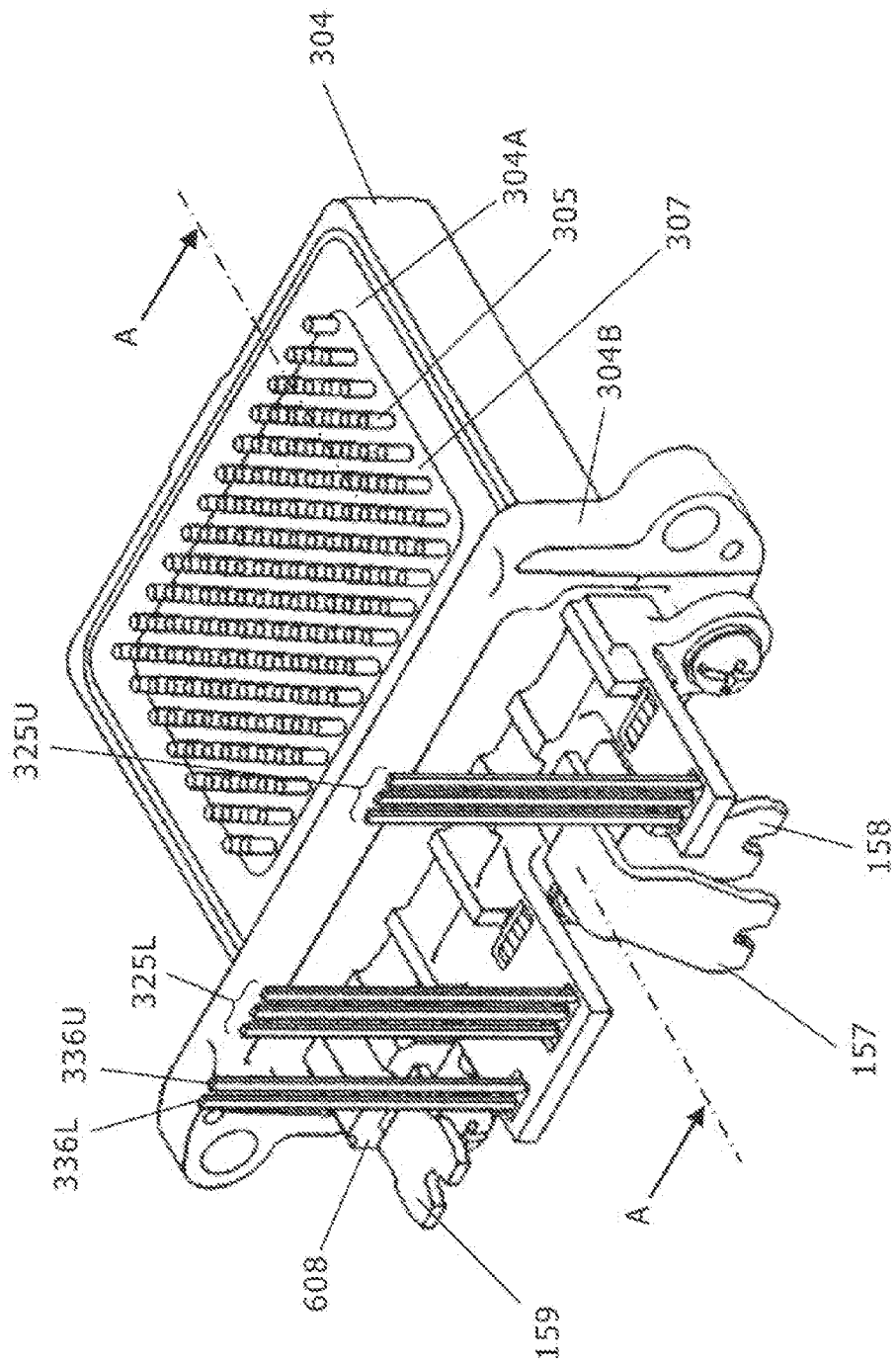
FIG. 8 is a perspective view of a power semiconductor module 300U.
Figure 9:
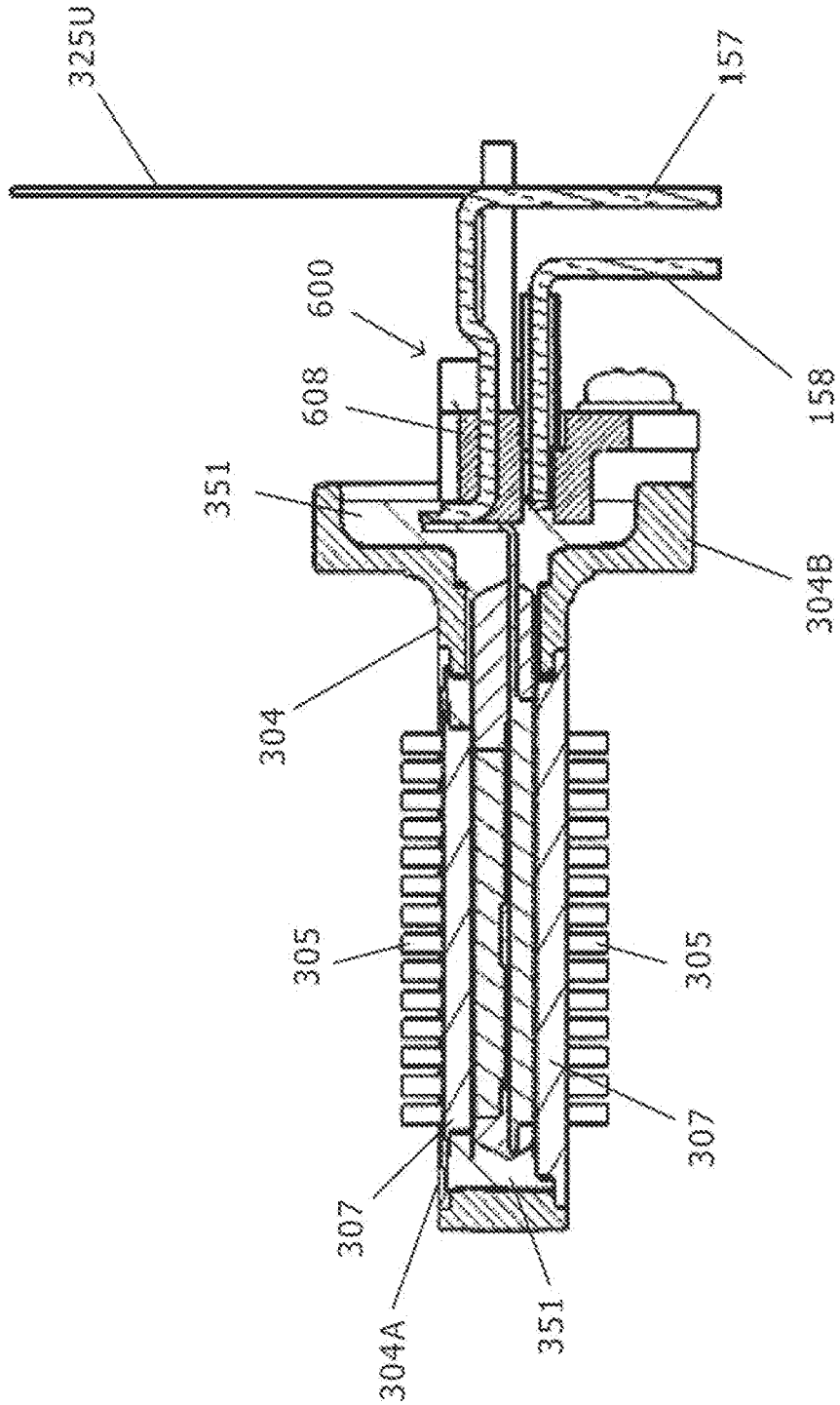
FIG. 9 is a cross-sectional view taken along the line A-A in FIG. 8.

FIG. 8 is a perspective view of the power semiconductor module 300U. FIG. 9 is a cross-sectional view taken along the line A-A in FIG. 8. As shown in FIG. 8, the power semiconductor module 300U is formed by encapsulating the semiconductor devices constituting the series circuit 150 (the IGBTs 328 and 330 and the diodes 156 and 166) in a metallic module case 304 as a can-type cooler. Here, the "can-type cooler" means a cooling case in a tubular shape having an insertion hole formed through one face (face provided with a flange 304B).

The module case 304 (case in a bottomed tubular shape) is made of aluminum alloy material (Al, AlSi, AlSiC, Al—C, etc.), for example, and is formed integrally to have no joints. The module case 304 is configured to have no openings other than the insertion hole which serves as an extracting part for extracting terminals, etc. The insertion hole is formed through the flange part 304B. The module case 304 is a flat case. The upper and lower faces of the module case 304 are provided with heat radiation walls 307 having cooling fins 305. As is seen in the cross-sectional view of FIG. 9, a thinned part 304A is formed around the heat radiation wall 307 formed on one face (upper face shown in FIG. 9) of the module case 304. By pressing the heat radiation wall 307 toward the opposite heat radiation wall 307, the module structure is sandwiched between the two heat radiation walls 307.

As shown in the cross-sectional view of FIG. 9, the module structure made up of the semiconductor devices, electrodes, etc. is inserted into the module case 304 and voids inside the module case 304 are filled with sealing resin 351. A relaying terminal 600 formed in the module structure is protruding from the insertion hole of the module case 304. The relaying terminal 600 is a terminal obtained by integrally forming the positive DC terminal 157, the negative DC terminal 158, the AC terminal 159, and signal terminals 325U, 325L, 336U and 336L.

Figure 10:
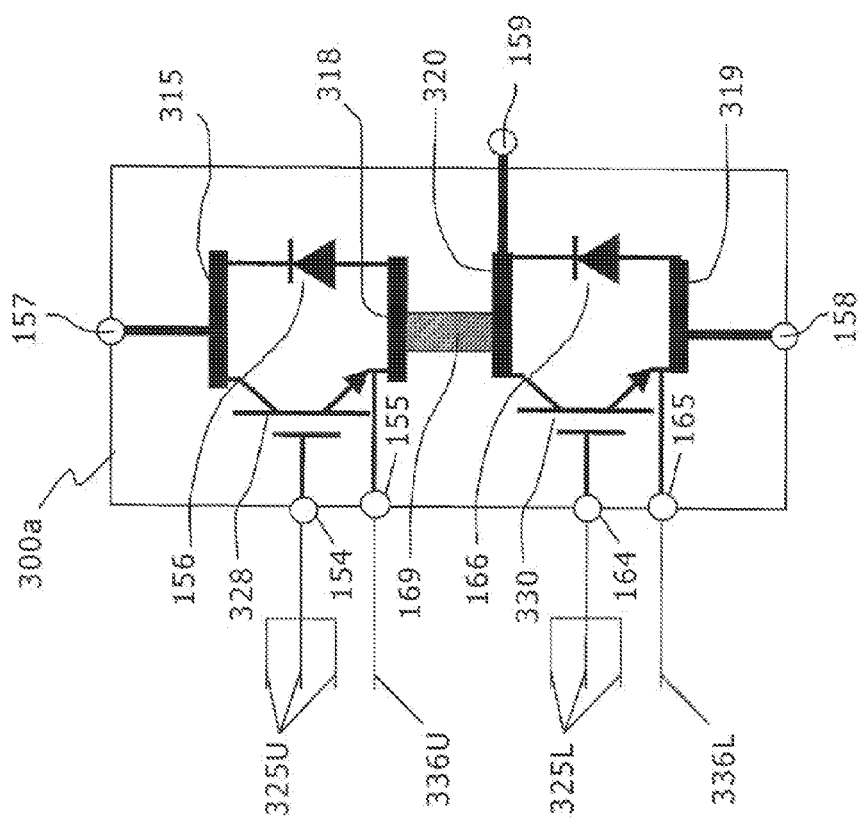
FIG. 10 is a circuit diagram showing built-in circuitry of the power module.

FIG. 10 is a circuit diagram showing built-in circuitry of the power module. The collector electrode of the upper-arm IGBT 328 and the cathode electrode of the upper-arm diode 156 are connected together via a conductor plate 315. The positive DC terminal 157 is connected to the conductor plate 315. The emitter electrode of the IGBT 328 and the anode electrode of the upper-arm diode 156 are connected together via a conductor plate 318. Three signal terminals 325U are connected to the gate electrode 154 of the IGBT 328 in parallel. The signal terminal 336U is connected to the signaling emitter electrode 155 of the IGBT 328.

On the other hand, the collector electrode of the lower-arm IGBT 330 and the cathode electrode of the lower-arm diode 166 are connected together via a conductor plate 320. The conductor plate 320 is connected to the conductor plate 318 by the intermediate electrode 169. The AC terminal 159 is connected to the conductor plate 320. The emitter electrode of the IGBT 330 and the anode electrode of the lower-arm diode 166 are connected together via a conductor plate 319. The negative DC terminal 158 is connected to the conductor plate 319. Three signal terminals 325L are connected to the gate electrode 164 of the IGBT 330 in parallel. The signal terminal 336L is connected to the signaling emitter electrode 165 of the IGBT 330.

Figure 11:
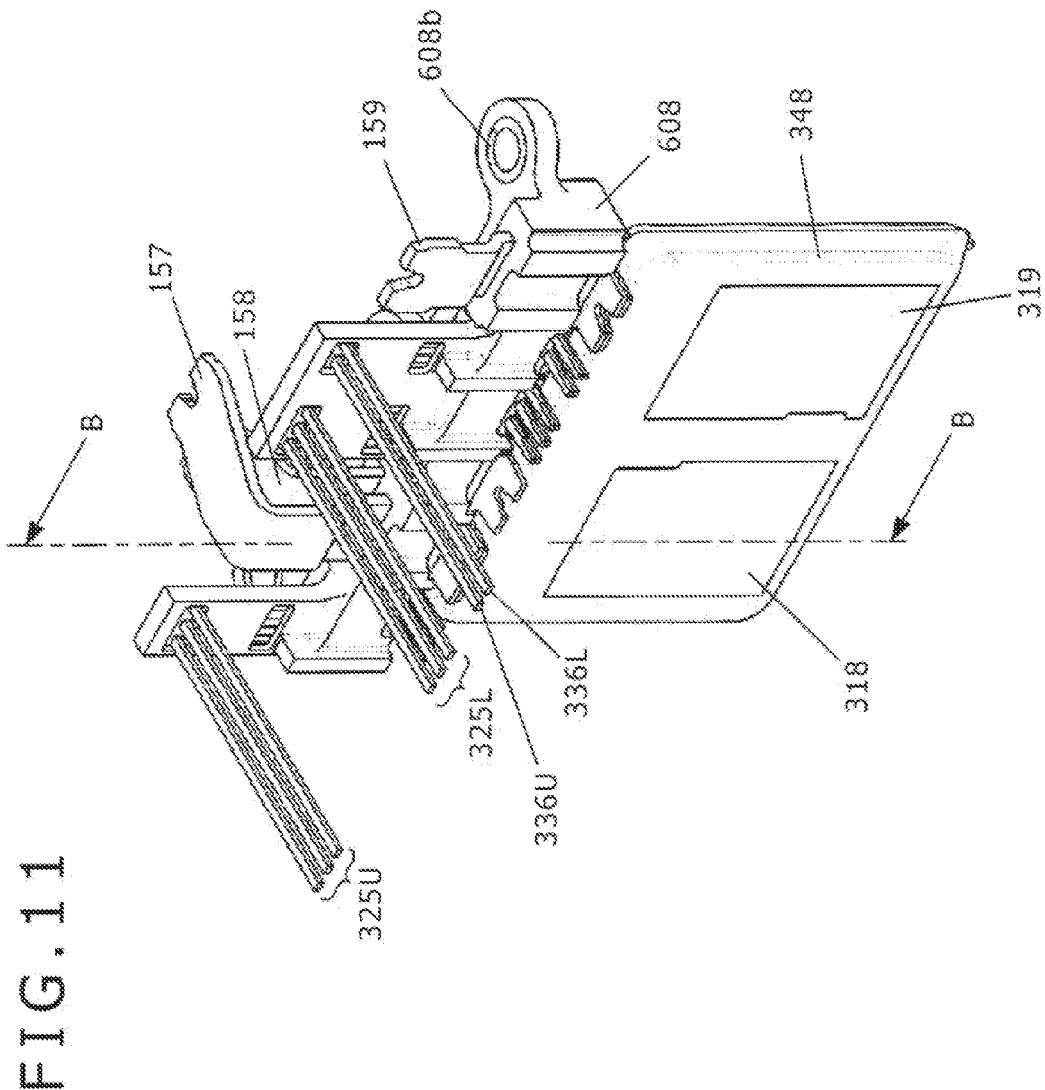
FIG. 11 is a perspective view of a module structure.
Figure 12:
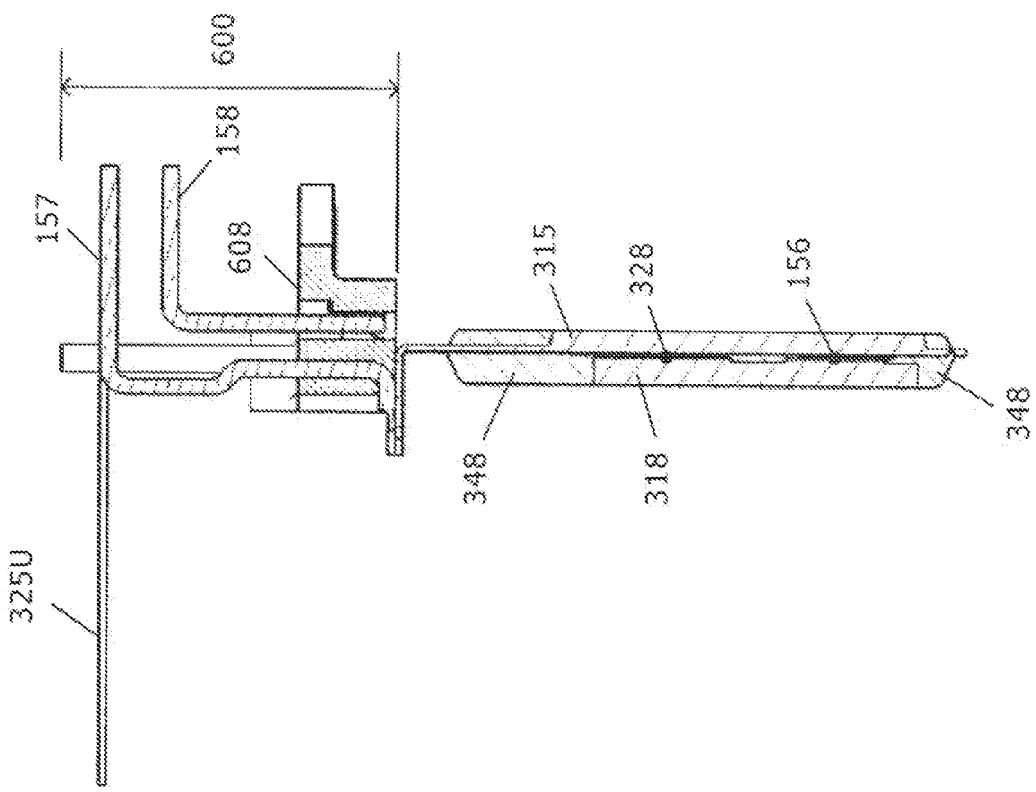
FIG. 12 is a cross-sectional view taken along the line B-B in FIG. 11.
Figure 13:
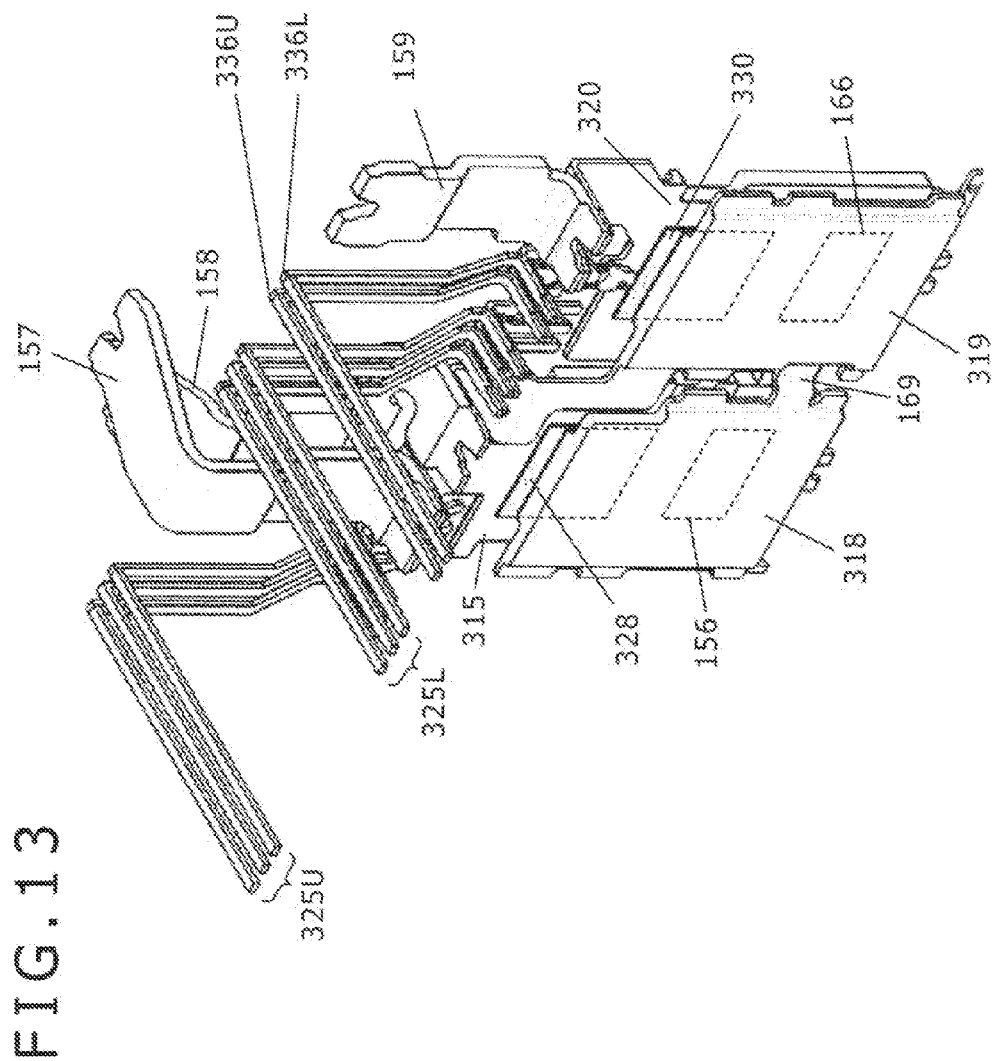
FIG. 13 is a schematic diagram showing the module structure from which resin molding 348 and a wiring insulation structure 608 have been removed.

FIGS. 11-13 are schematic diagrams for explaining the module structure. Specifically, FIG. 11 is a perspective view of the module structure. FIG. 12 is a cross-sectional view taken along the line B-B in FIG. 11. The B-B cross section is a cross section of the same part as the A-A cross section shown in FIG. 8. FIG. 13 is a schematic diagram showing a state in which resin molding 348 and a wiring insulation structure 608 have been removed from the module structure shown in FIG. 11.

Electrodes of the semiconductor devices (the IGBTs 328 and 330 and the diodes 156 and 166) are formed on both surfaces of a chip. As shown in FIG. 13, the IGBT 328 and the diode 156 of the upper arm are sandwiched by the conductor plates 315 and 318. Sheet-like metallic binders (e.g., solder sheets) are arranged between the surfaces of the semiconductor devices and the conductor plates 315 and 318. The semiconductor devices and the conductor plates 315 and 318 are bound together by melting and solidifying the metallic binders. Similarly, the IGBT 330 and the diode 166 of the lower arm are sandwiched by the conductor plates 319 and 320. The conductor plates 318 and 320 are connected together by the intermediate electrode 169.

The positive DC terminal 157 connected to the conductor plate 315 is formed to stand from the part of the module case 304 having the flange 304B (see FIG. 8). The tip end part (connecting portion) of the positive DC terminal 157 is bent to the right in FIGS. 11-13 substantially at the right angle so as to point in the direction opposite to the conductor plate 318. Similarly to the positive DC terminal 157, the negative DC terminal 158 connected to the conductor plate 319 is also bent in the middle to the right substantially at the right angle. In contrast, the AC terminal 159 connected to the conductor plate 320 is formed to stand straight without bending in the middle.

Oppositely to the positive DC terminal 157 and the negative DC terminal 158, the signal terminals 325U, 325L, 336U and 336L bend in the middle in the direction of the conductor plate 318. In other words, the tip end parts (connecting portions) of the signal terminals 325U, 325L, 336U and 336L point in the direction opposite to the tip end parts of the positive DC terminal 157 and the negative DC terminal 158 (see FIG. 12).

By performing the transfer molding on the module structure shown in FIG. 13, the semiconductor devices sandwiched by the conductor plates 315, 318, 319 and 320 are covered with the resin molding 348 as shown in FIG. 11. In this case, outside surfaces of the conductor plates 315, 318, 319 and 320 sandwiching the semiconductor devices are exposed from the resin molding 348 as shown in FIG. 11 since the outside surfaces should function as heat radiation surfaces. The positive DC terminal 157, the negative DC terminal 158, the AC terminal 159, and the signal terminals 325U, 325L, 336U and 336L are integrated together by the wiring insulation structure 608. A fixation part 608b to be used for fixing the wiring insulation structure 608 to the flange 304B of the module case 304 is formed in the wiring insulation structure 608. A through hole for a screw for the fixation is formed through the fixation part 608b.

The module structure in the state shown in FIGS. 11 and 12 is inserted into the module case 304. Then, the heat radiation walls 307 are pressed toward the inside of the case so that the inner surfaces of the heat radiation walls 307 adhere to the exposed surfaces of the conductor plates 315, 318, 319 and 320. Incidentally, insulating sheets excelling in the heat conduction performance are arranged between the conductor plates 315, 318, 319 and 320 and the heat radiation walls 307. Thereafter, the sealing resin 351 is filled into the voids inside the module case 304 and solidified, by which the power semiconductor module 300U is completed.

The power semiconductor modules 300U-300W are fixed to the openings 120U-120W of the coolant channel body 12A so that the signal terminals 325U, 325L, 336U and 336L face the bus bar holder fixation side of the coolant channel body 12A (i.e., the opening side of the housing 10) as shown in FIG. 7. Thereafter, the power semiconductor modules 300U-300W are fixed to the coolant channel body 12A and then the bus bar holder 800 (to which the AC bus bars 802U, 802V and 802W and the current sensor module 180 have been attached) is fixed to the upper face of the coolant channel body 12A.

Figure 14:
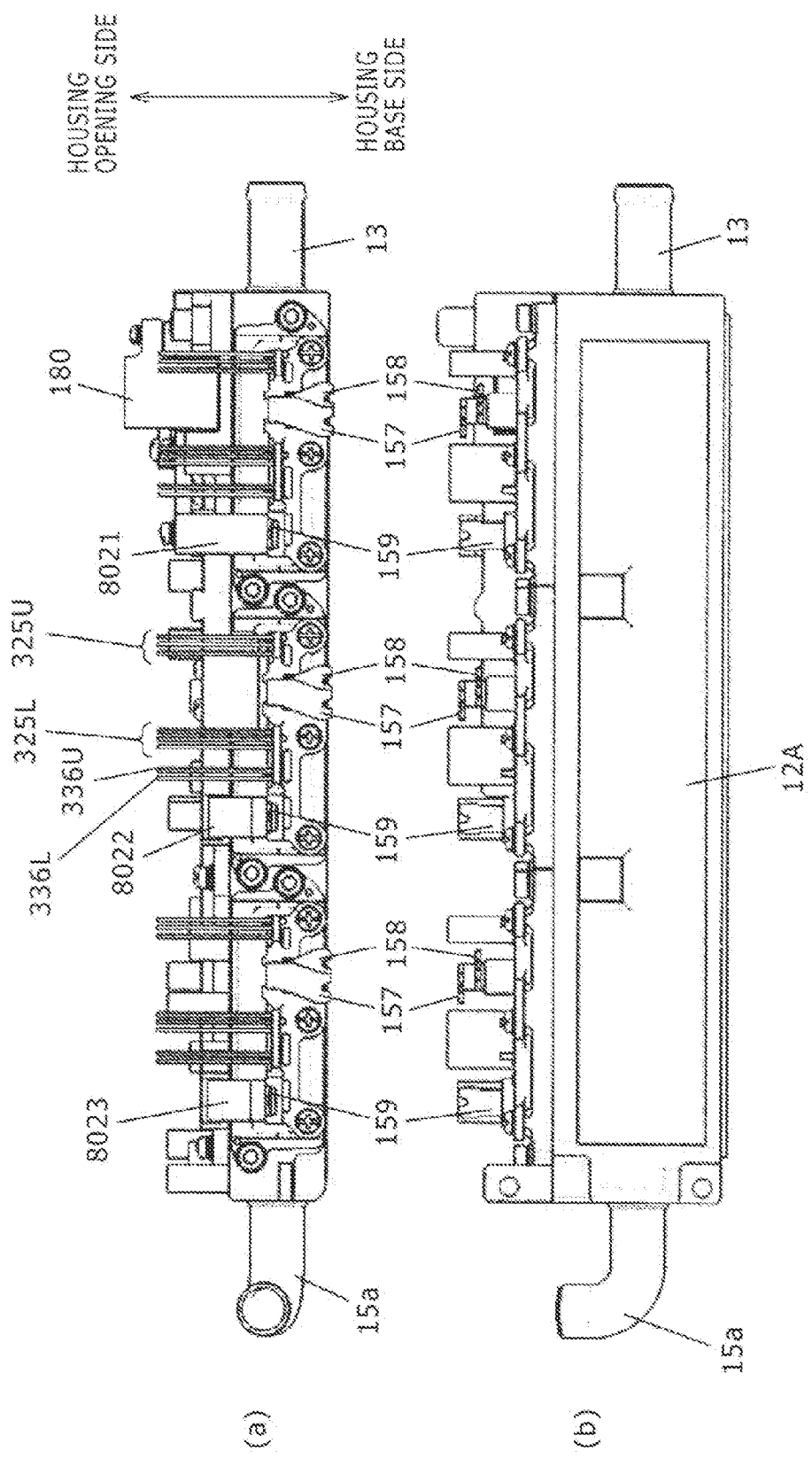
FIG. 14 is a schematic diagram showing a coolant channel body 12A to which power semiconductor modules 300U-300W and a bus bar holder 800 have been attached.

FIG. 14 is a schematic diagram showing the coolant channel body 12A to which the power semiconductor modules 300U-300W and the bus bar holder 800 have been attached. Specifically, FIG. 14(a) is a side view showing the side of the coolant channel body 12A through which the openings 120U-120W have been formed (i.e., the side facing the capacitor unit 4) and FIG. 14(b) is a schematic diagram showing the base side of the coolant channel body 12A. In FIG. 14(a), the downward direction corresponds to the base side of the housing 10 and the upward direction corresponds to the opening side of the housing 10. As shown in FIG. 14(a), the positive DC terminal 157, the negative DC terminal 158, the AC terminal 159, and the signal terminals 325U, 325L, 336U and 336L in the power module unit 5 are all arranged on the side facing the capacitor unit 4. The positive DC terminal 157 and the negative DC terminal 158 extend to the base side of the housing 10. In contrast, the signal terminals 325U, 325L, 336U and 336L extend to the opening side of the housing 10.

The connecting portions 8021, 8022 and 8023 of the AC bus bars 802U-802W to be connected to the power semiconductor modules 300U-300W are bent toward the base side of the housing 10 as shown in FIG. 14(a). When the bus bar holder 800 is fixed to the upper face of the coolant channel body 12A, the tip end parts of the connecting portions 8021-8023 make contact with the AC terminals 159 of the power semiconductor modules 300U-300W. By welding the contacting parts, the AC bus bars 802U-802W are connected to the power semiconductor modules 300U-300W. After the welding, the shielding plate 50 is fixed to the bus bar holder 800. Consequently, the power module unit 5 shown in FIG. 6 is completed.

(Explanation of Capacitor Unit 4)

Figure 15:
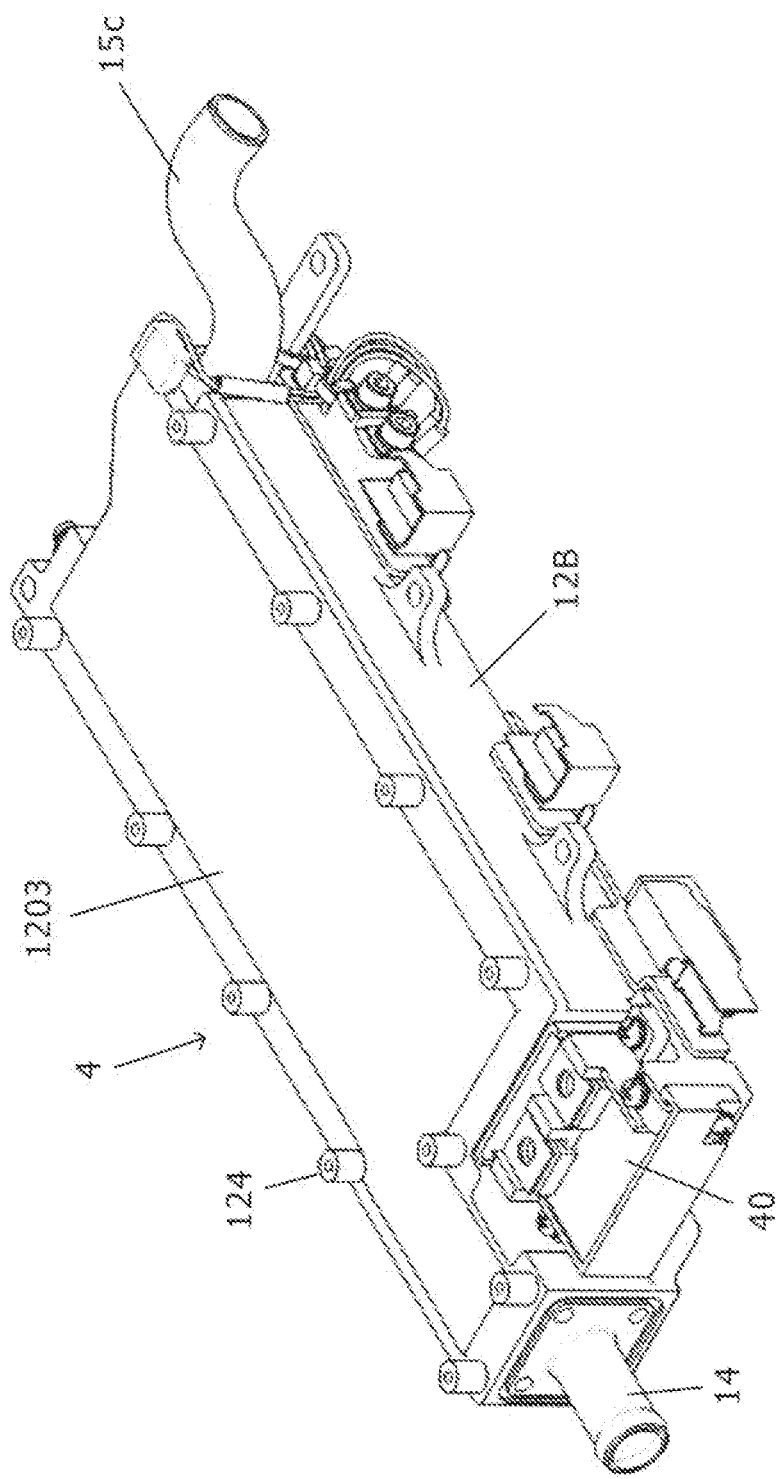
FIG. 15 is a perspective view showing a capacitor unit 4.
Figure 16:
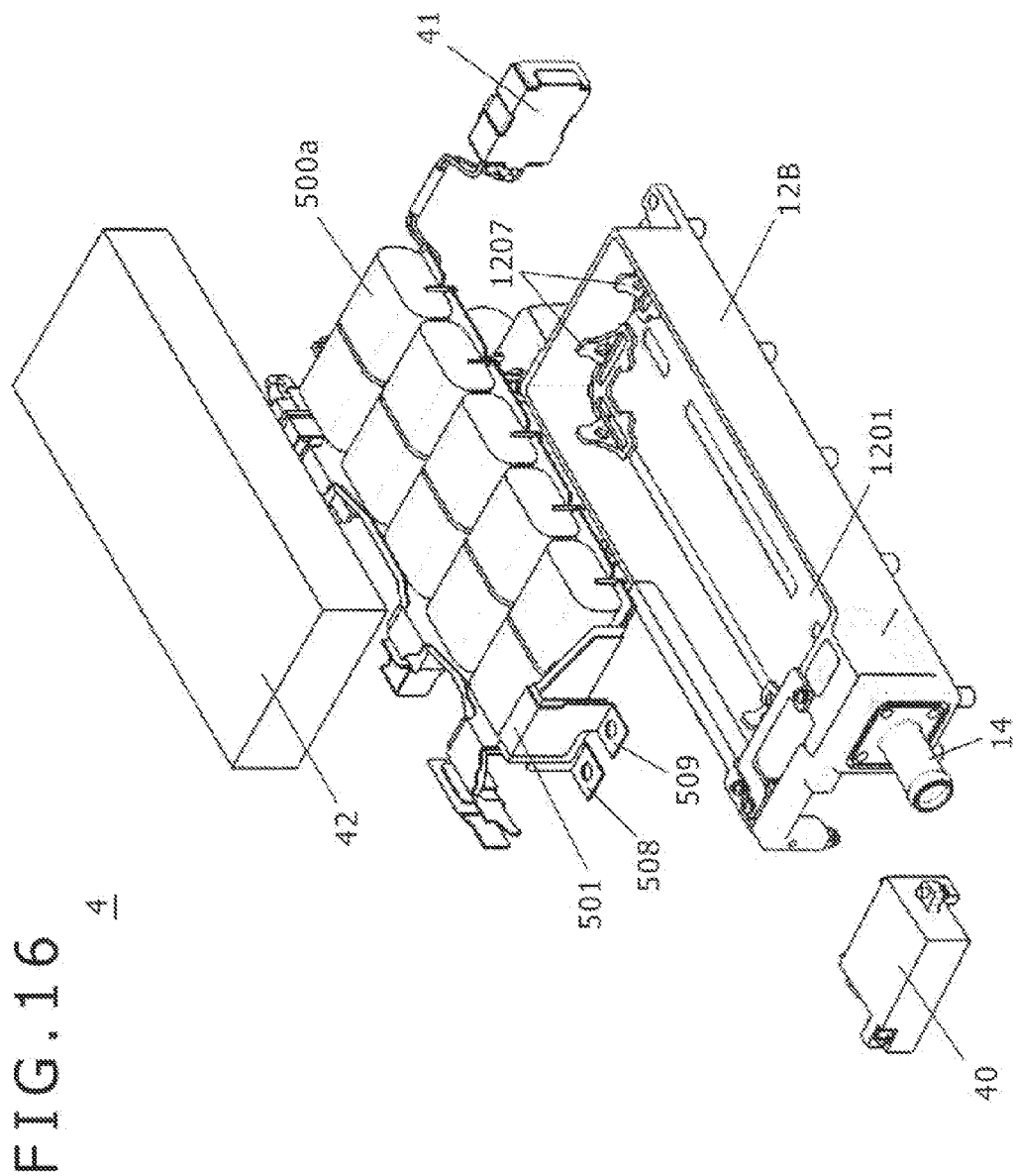
FIG. 16 is an exploded perspective view of the capacitor unit 4.

FIGS. 15 and 16 are schematic diagrams showing the capacitor unit 4, wherein FIG. 15 is a perspective view and FIG. 16 is an exploded perspective view. As shown in FIG. 16, the capacitor unit 4 includes a coolant channel body 12B (as a casing in which a coolant channel has been formed), a plurality of capacitor elements 500a, a capacitor bus bar 501, a Y-capacitor 40, a discharge resistor 41, and a capacitor resin 42. The capacitor elements 500a, which constitute the capacitor 500 shown in FIG. 2, are connected to the capacitor bus bar 501 in parallel as explained later. The capacitor 500 is formed of one or more capacitor elements 500a.

The Y-capacitor 40, which is provided for preventing noise, is connected to the power supply terminals 508 and 509 (DC input side) of the capacitor bus bar 501. The discharge resistor 41 is provided for discharging electric charges accumulating in the capacitor elements 500a when the power conversion device is stopped. The discharge resistor 41 is connected to the capacitor bus bar 501. The capacitor resin 42 is an insulating resin for molding the whole of the capacitor elements 500a and the capacitor bus bar 501 stored in an accommodating portion 1201 of the coolant channel body 12B. The rectangular shape shown in FIG. 16 indicates the shape of the capacitor resin 42 after the solidification.

Figure 17:
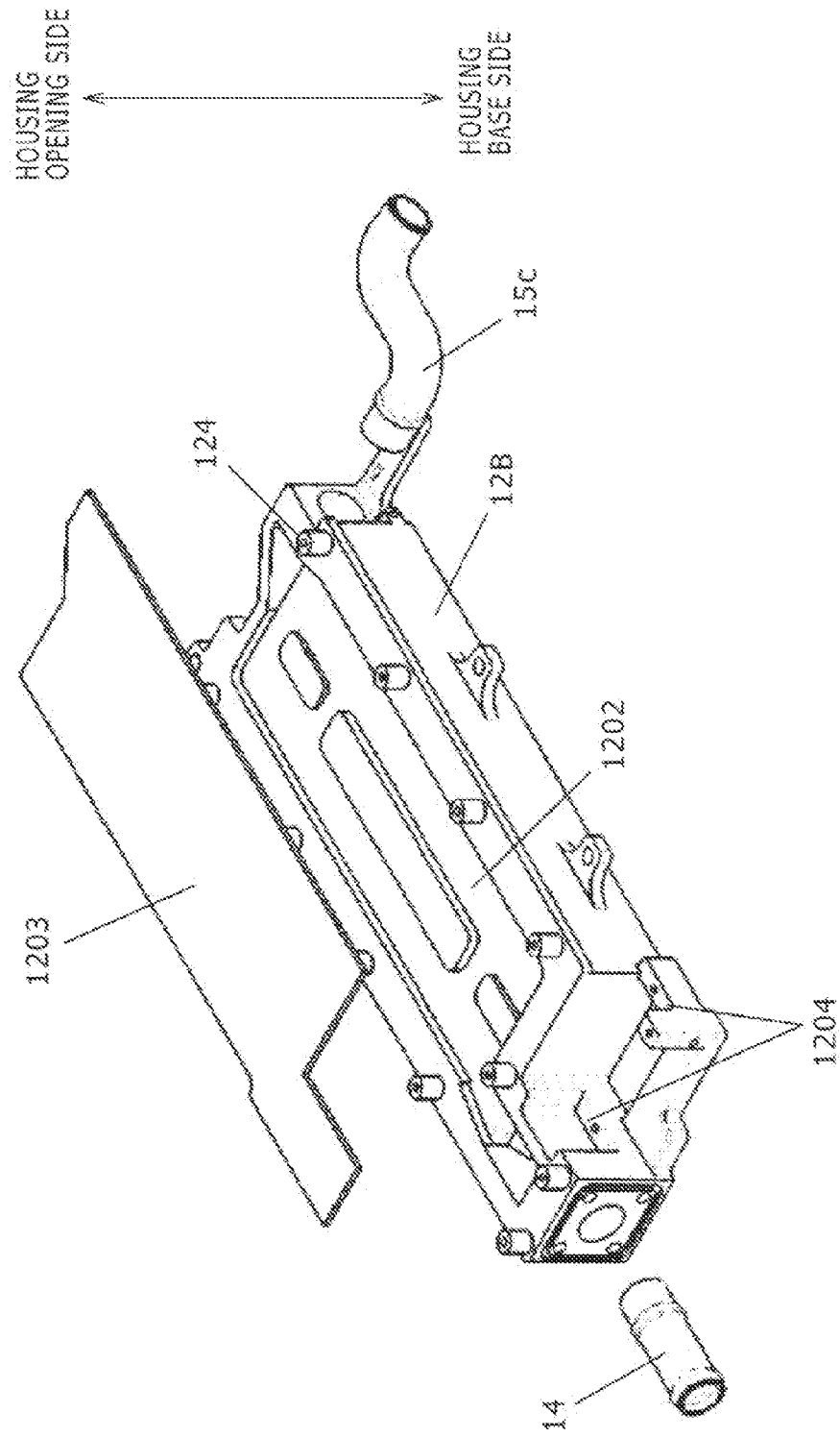
FIG. 17 is a schematic diagram for explaining a coolant channel body 12B (exploded perspective view viewing the coolant channel body 12B from a housing opening side).
Figure 18:
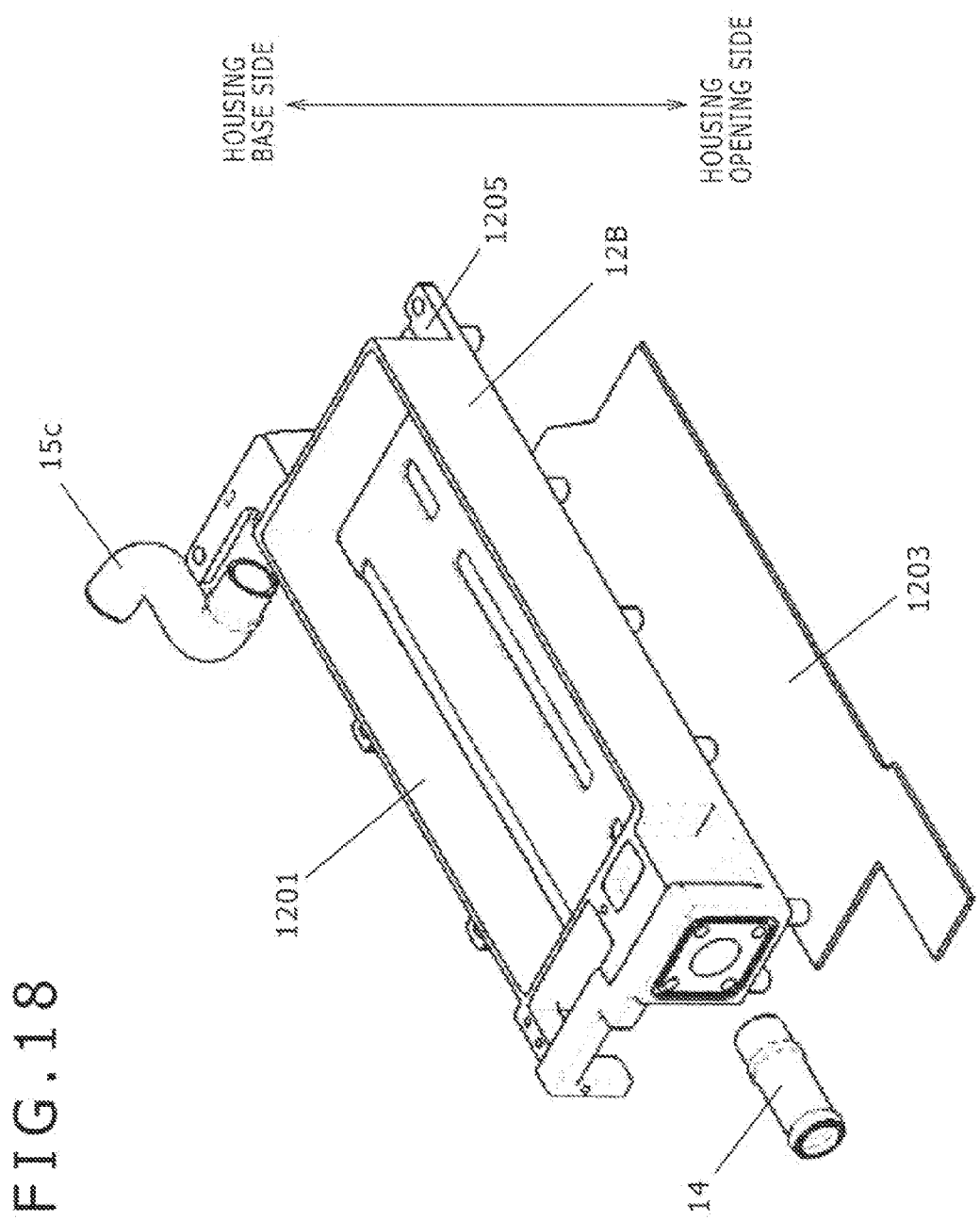
FIG. 18 is a schematic diagram for explaining the coolant channel body 12B (exploded perspective view viewing the coolant channel body 12B from a housing base side).

FIGS. 17 and 18 are schematic diagrams for explaining the coolant channel body 12B. The arrows in FIGS. 17 and 18 indicate the base side of the housing 10 (housing base side) and the opening side of the housing 10 (housing opening side). As shown in FIG. 17, a coolant channel 1202 is formed on the housing opening side of the coolant channel body 12B. The inlet of the coolant channel 1202 is provided with a pipe 15c for taking in the coolant, while the outlet of the coolant channel 1202 is provided with a pipe 14 for discharging the coolant. To the base of the coolant channel body 12B made of metal, a metallic cover 1203 is welded so as to cover the coolant channel 1202. The housing base side of the coolant channel 1202 is sealed up by attaching the cover 1203. The coolant flowing in through the pipe 15c flows through the coolant channel 1202 and is discharged through the pipe 14.

Incidentally, the base of the coolant channel body 12B faces the opening side of the housing 10, and a plurality of pillars 124 for fixing the circuit board 20 are formed on the base of the coolant channel body 12B. A fixation part 1204 for attaching the Y-capacitor 40 is formed on an end face of the coolant channel body 12B (at an end in the lengthwise direction). The Y-capacitor 40 is screwed to the fixation part 1204.

FIG. 18 is a schematic diagram showing the shape of the housing base side of the coolant channel body 12B. A concave part constituting the accommodating portion 1201 is formed on the housing base side of the coolant channel body 12B. The coolant channel 1202 shown in FIG. 17 is formed on the bottom (housing opening side) of the accommodating portion 1201. A fixation part 1205 for attaching the discharge resistor 41 is formed on an end face of the coolant channel body 12B that is provided with the pipe 15c. The discharge resistor 41 is attached to the fixation part 1205 by using screws. The coolant channel body 12B having the coolant channel 1202 formed therein functions as a cooler for cooling down the components (capacitor elements 500a, the capacitor bus bar 501, the Y-capacitor 40 and the discharge resistor 41) fixed thereto.

(Explanation of Capacitor Bus Bar 501)

Figure 19:
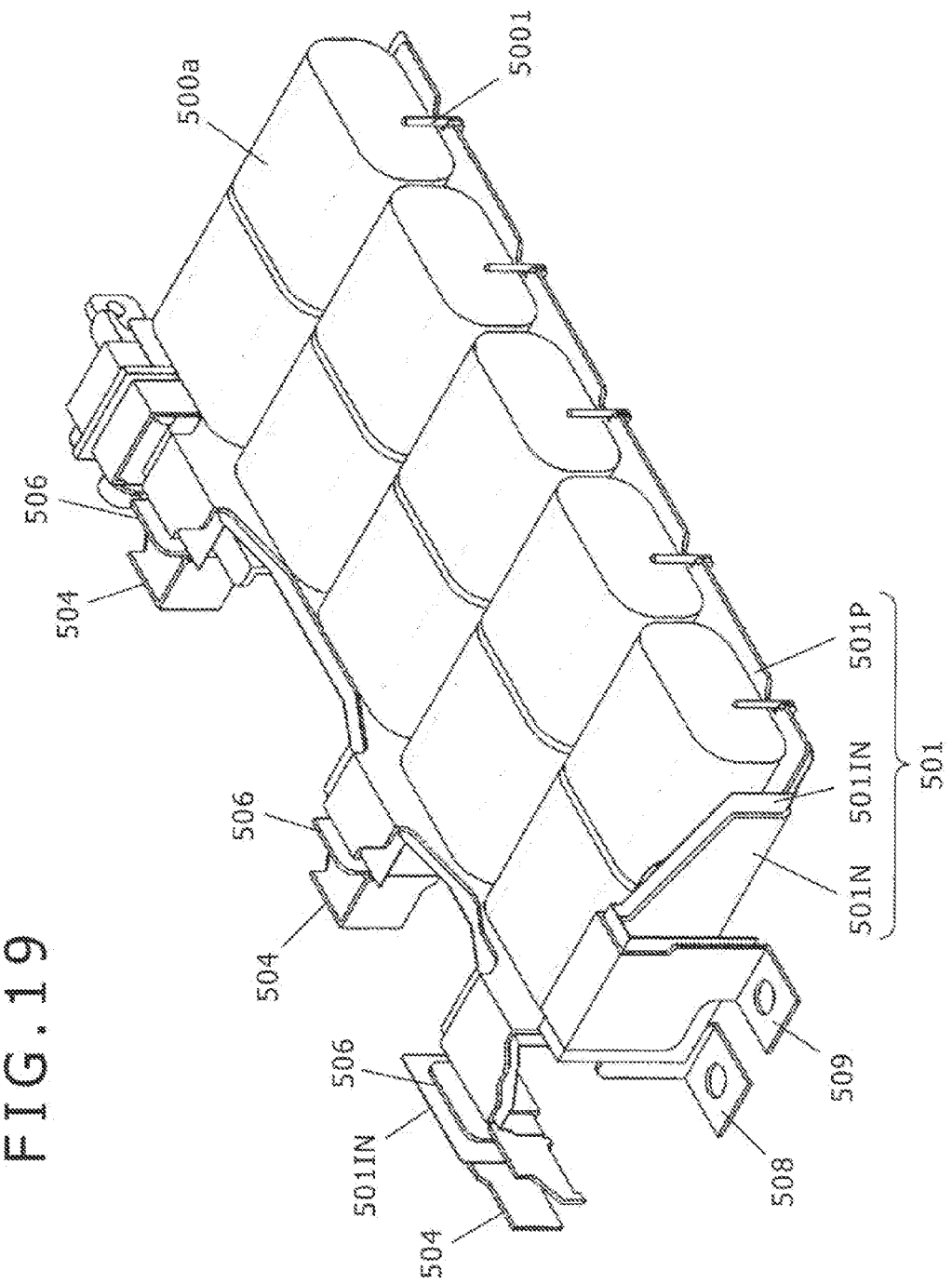
FIG. 19 is a perspective view showing a capacitor bus bar 501 to which a plurality of capacitor elements 500a have been connected.
Figure 20:
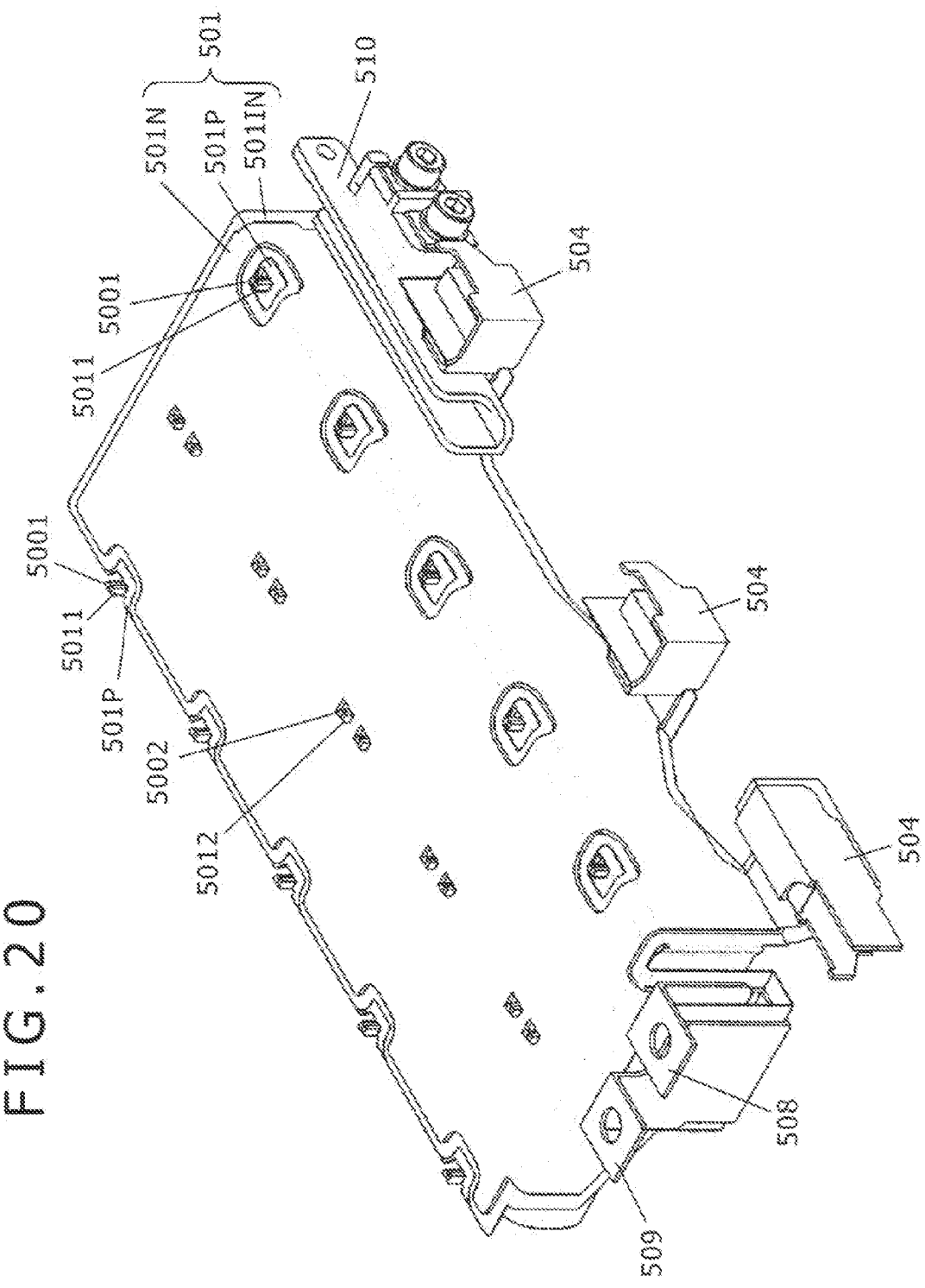
FIG. 20 is a schematic diagram showing the back side of the capacitor bus bar 501 shown in FIG. 19.
Figure 21:
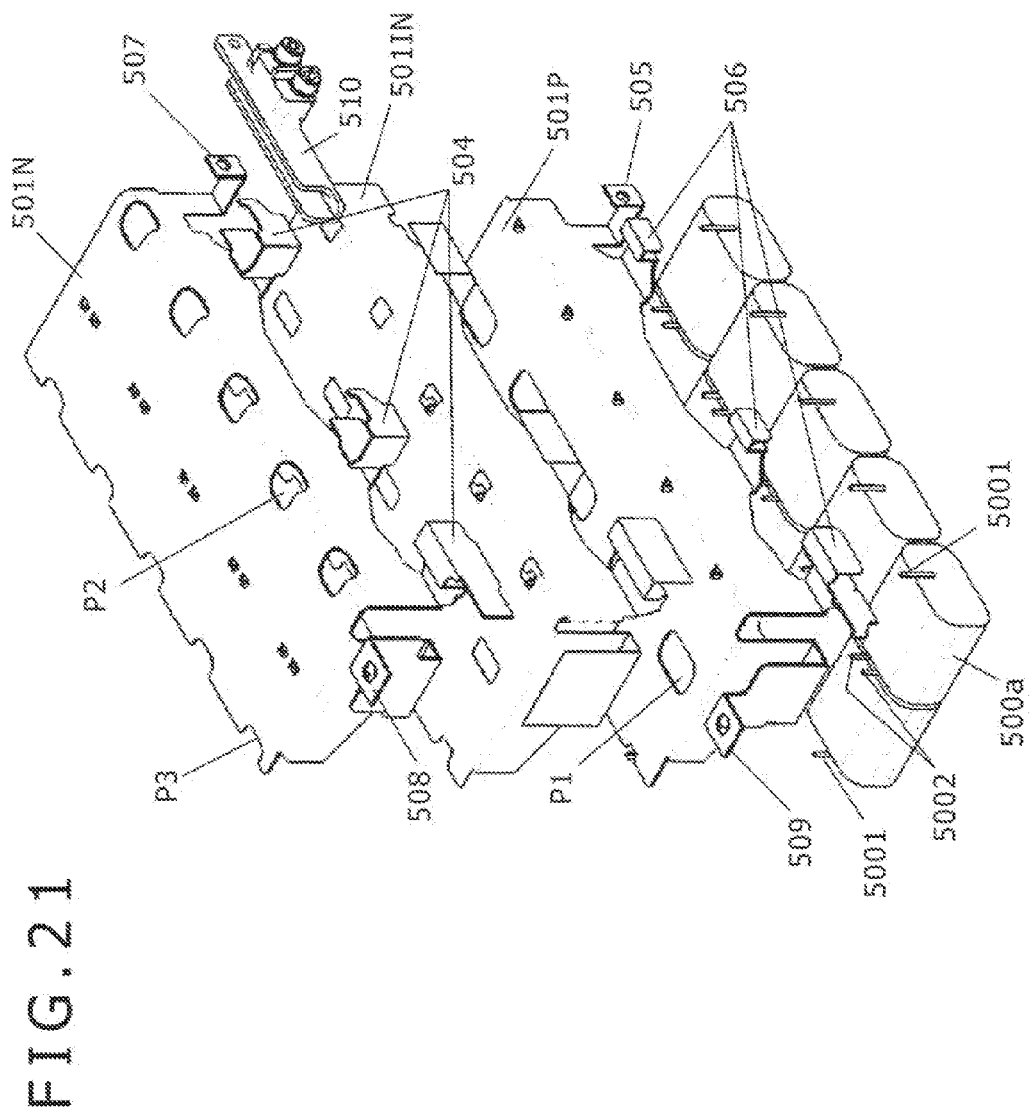
FIG. 21 is an exploded perspective view of the capacitor bus bar 501.
Figure 22:
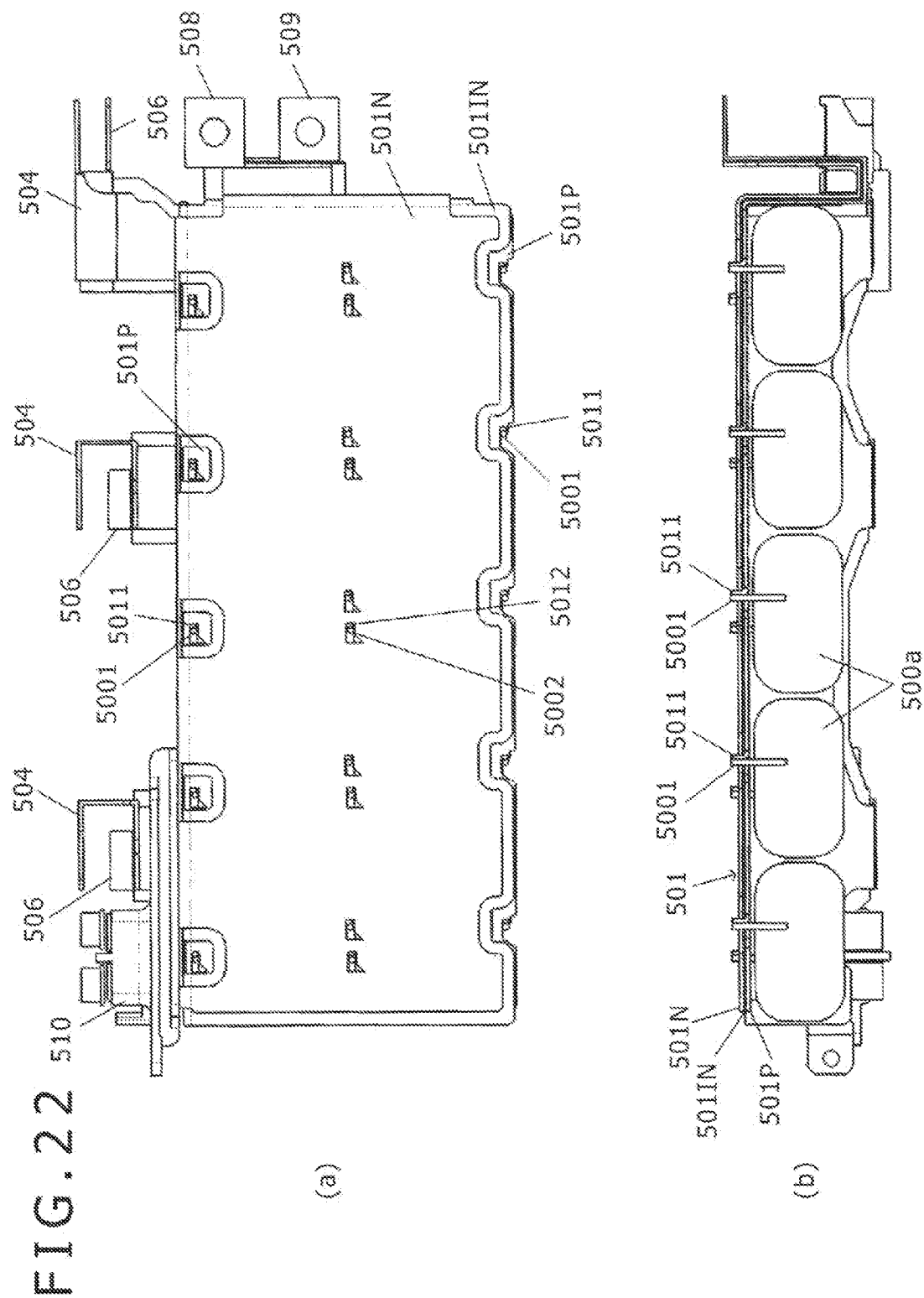
FIG. 22 is a schematic diagram for explaining the connection of terminals 5001, terminals 5002, a positive bus bar 501P and a negative bus bar 501N.

FIGS. 19-22 are schematic diagrams for explaining the capacitor bus bar 501. A plurality of capacitor elements 500a are connected to the capacitor bus bar 501. The capacitor elements 500a have been connected together to be mounted on the capacitor bus bar 501. FIG. 19 is a perspective view showing the capacitor bus bar 501 to which the capacitor elements 500a have been connected. FIG. 20 is a schematic diagram showing the back side of the capacitor bus bar 501 shown in FIG. 19. FIG. 21 is an exploded perspective view of the capacitor bus bar 501. FIG. 22 is a schematic diagram for explaining the connection of the capacitor bus bar 501 and the capacitor elements 500a.

As shown in FIG. 21, the capacitor bus bar 501 is made up of a positive bus bar 501P, a negative bus bar 501N, and an insulation sheet 501IN. The insulation sheet 501IN is provided for the insulation between the positive bus bar 501P and the negative bus bar 501N. The capacitor bus bar 501 is formed by stacking up the bus bars 501P and 501N to sandwich the insulation sheet 501IN between them. Thereafter, the capacitor elements 500a are mounted on the positive bus bar 501P.

The positive power supply terminal 509 and the positive capacitor terminals 506 are formed on the positive bus bar 501P. The capacitor terminals 506 are terminals for connecting the positive bus bar 501P with the positive DC terminal 157 of the power semiconductor modules 300U, 300V and 300W of the power module unit 5. Three of the capacitor terminals 506 are formed at positions corresponding to the positive DC terminals 157 of the power semiconductor modules 300U, 300V and 300W.

On the other hand, the negative power supply terminal 508 and the negative capacitor terminals 504 are formed on the negative bus bar 501N. The capacitor terminals 504 are terminals for connecting the negative bus bar 501N with the negative DC terminals 158 of the power semiconductor modules 300U, 300V and 300W of the power module unit 5. Three of the capacitor terminals 504 are formed at positions corresponding to the negative DC terminals 158 of the power semiconductor modules 300U, 300V and 300W.

L-shaped parts 505 and 507 to be used for fixing the positive bus bar 501P and the negative bus bar 501N in the stacked state are formed on the bus bars 501P and 501N, respectively. Each L-shaped part 505, 507 has a through hole. The L-shaped parts 505 and 507 are fixed to a terminal member 510 (separate component) by using bolts. Consequently, the positive bus bar 501P, the insulation sheet 501IN and the negative bus bar 501N are integrated together via the terminal member 510 as shown in FIG. 20. Wires of the discharge resistor 41 (see FIG. 16) are connected to the terminal member 510, by which the discharge resistor 41 is connected to the positive bus bar 501P and the negative bus bar 501N.

As shown in FIG. 21, a positive terminal 5001 and a negative terminal 5002 are formed on the end faces of each capacitor element 500a which is implemented by a film capacitor. Two capacitor elements 500a aligned in an axial direction are arranged so that their end faces having the terminals 5002 face each other. The positive terminals 5001 and the negative terminals 5002 penetrate the positive bus bar 501P, the insulation sheet 501IN and the negative bus bar 501N and project to the back side of the capacitor bus bar 501 (see FIGS. 20 and 22).

As shown in FIG. 21, through holes P1 of the positive bus bar 501P for the negative terminals 5002 are formed large so that the terminals 5002 do not contact the positive bus bar 501P. Similarly, through holes P2 and notches P3 of the negative bus bar 501N for the positive terminals 5001 are formed large so that the terminals 5001 do not contact the negative bus bar 501N.

FIG. 22 is a schematic diagram for explaining the connection of the terminals 5001, the terminals 5002, the positive bus bar 501P and the negative bus bar 501N. Specifically, FIG. 22(a) is a schematic diagram showing the base side of the capacitor bus bar 501 and FIG. 22(b) is a side view. The positive bus bar 501P has projections 5011 respectively formed at positions in the vicinity of the positive terminals 5001 penetrating the positive bus bar 501P. By welding the projections 5011 and the corresponding terminals 5001 together, the positive sides of the capacitor elements 500a are connected to the positive bus bar 501P. Similarly, the negative bus bar 501N has projections 5012 respectively formed at positions in the vicinity of the negative terminals 5002 penetrating the negative bus bar 501N. By welding the projections 5012 and the corresponding terminals 5002 together, the negative sides of the capacitor elements 500a are connected to the negative bus bar 501N.

Figure 23:
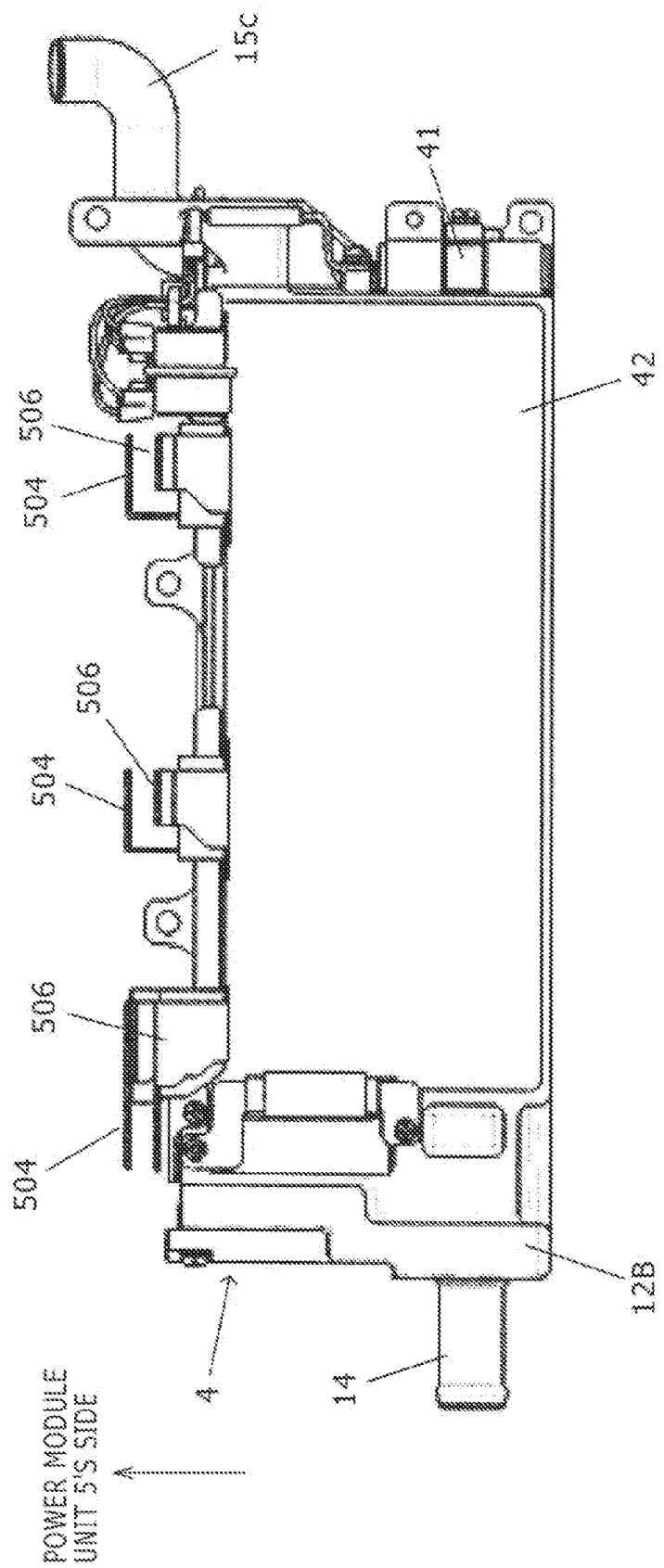
FIG. 23 is a schematic diagram in which the capacitor unit 4 is viewed from the housing base side.

The capacitor elements 500a and the capacitor bus bar 501, which have been integrated by the welding of the terminals 5001 and 5002, are stored in the accommodating portion 1201 of the coolant channel body 12B so that the capacitor bus bar 501 is situated at the bottom of the accommodating portion 1201 as shown in FIG. 16. Resin holders 1207 are arranged at the four corners of the accommodating portion 1201 in order to properly position the capacitor bus bar 501 and secure the insulating distance between the capacitor bus bar 501 and the coolant channel body 12B. Thereafter, the capacitor resin 42 is filled into the accommodating portion 1201 to resin seal the capacitor elements 500a and the capacitor bus bar 501, by which the capacitor unit 4 shown in FIG. 15 is completed. FIG. 23 is a schematic diagram in which the capacitor unit 4 is viewed from the housing base side. The top of FIG. 23 corresponds to the power module unit 5's side. The capacitor unit 4 is arranged so that the positive capacitor terminals 506 and the negative capacitor terminals 504 project to the side facing the power module unit 5.

Figure 24:
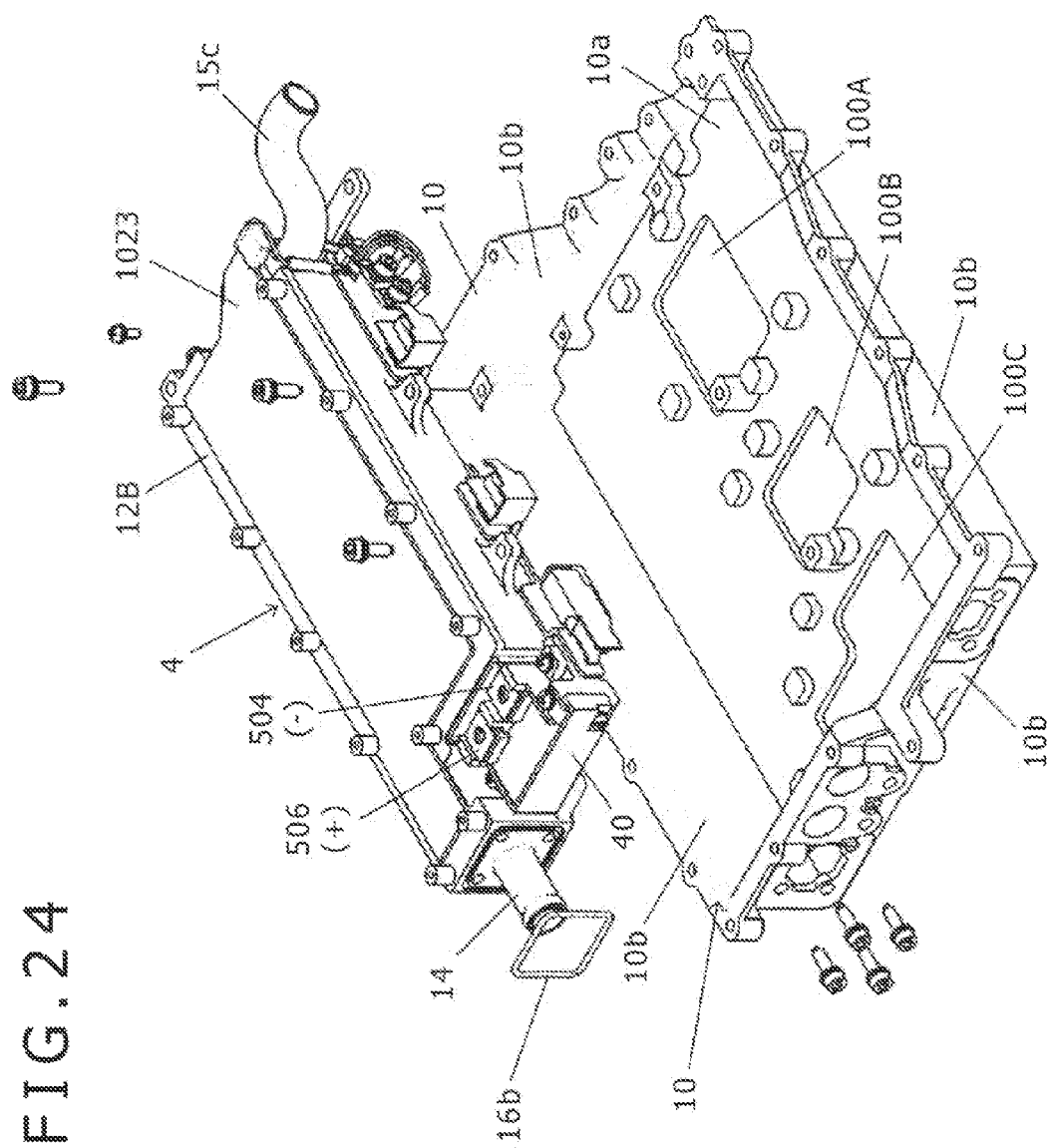
FIG. 24 is a schematic diagram for explaining the installation of the capacitor unit 4 in the housing 10.

As the first step after the completion of the capacitor unit 4 and the power module unit 5, the capacitor unit 4 is fixed in the housing 10 by using bolts as shown in FIG. 24. In this step, a gasket 16b (e.g., O-ring seal) is arranged between the housing 10 and an end face of the coolant channel body 12B having the pipe 14. Through the base 10a of the housing 10, large openings 100A, 100B and 100C are formed at positions where the capacitor terminals 506 and 504 of the capacitor unit 4 face each other.

Figure 25:
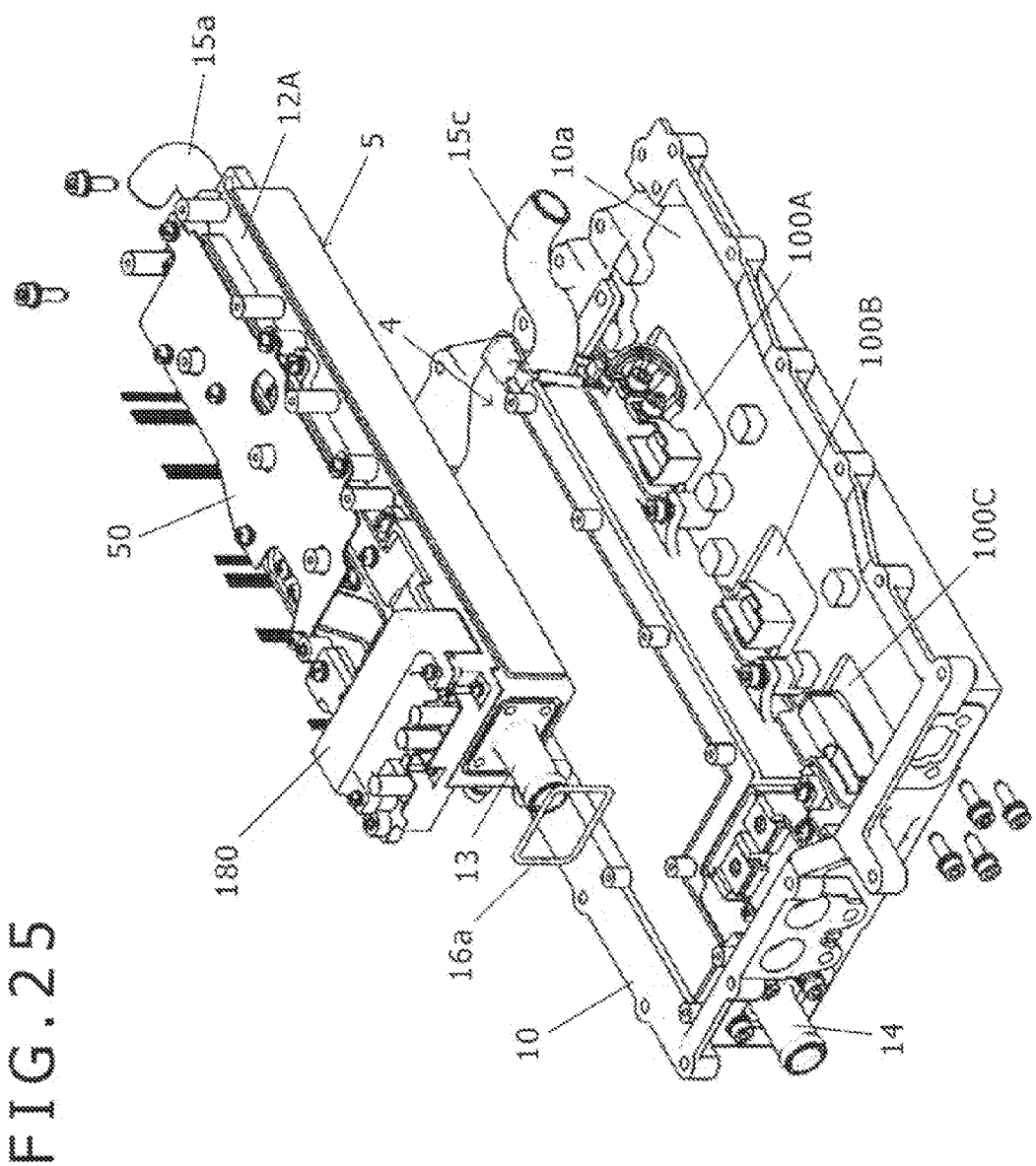
FIG. 25 is a schematic diagram for explaining the installation of the power module unit 5 in the housing 10.

Thereafter, the power module unit 5 is fixed in the housing 10 by using bolts as shown in FIG. 25. In this step, a gasket 16a similar to the aforementioned gasket 16b is arranged between the housing 10 and an end face of the coolant channel body 12A having the pipe 13. The pipe 15a of the coolant channel body 12A and the pipe 15c of the coolant channel body 12B are connected together by using a pipe 15b (see FIG. 5).

As shown in FIG. 5, the capacitor unit 4 is arranged nearby a long side of the housing 10, while the power module unit 5 is arranged nearby the other long side of the housing 10. The capacitor unit 4 and the power module unit 5 are arranged so that a prescribed space S is formed between the coolant channel body 12B and the coolant channel body 12A. The signal terminals 325U, 325L, 336U and 336L are extracted from the module case 304 to the prescribed space S and then bent so as to extend toward the opening side of the housing 10 (toward the upper cover 3). The openings 100A, 100B and 100C formed through the base 10a of the housing 10 (see FIG. 24) are situated under the prescribed space S.

Figure 26:
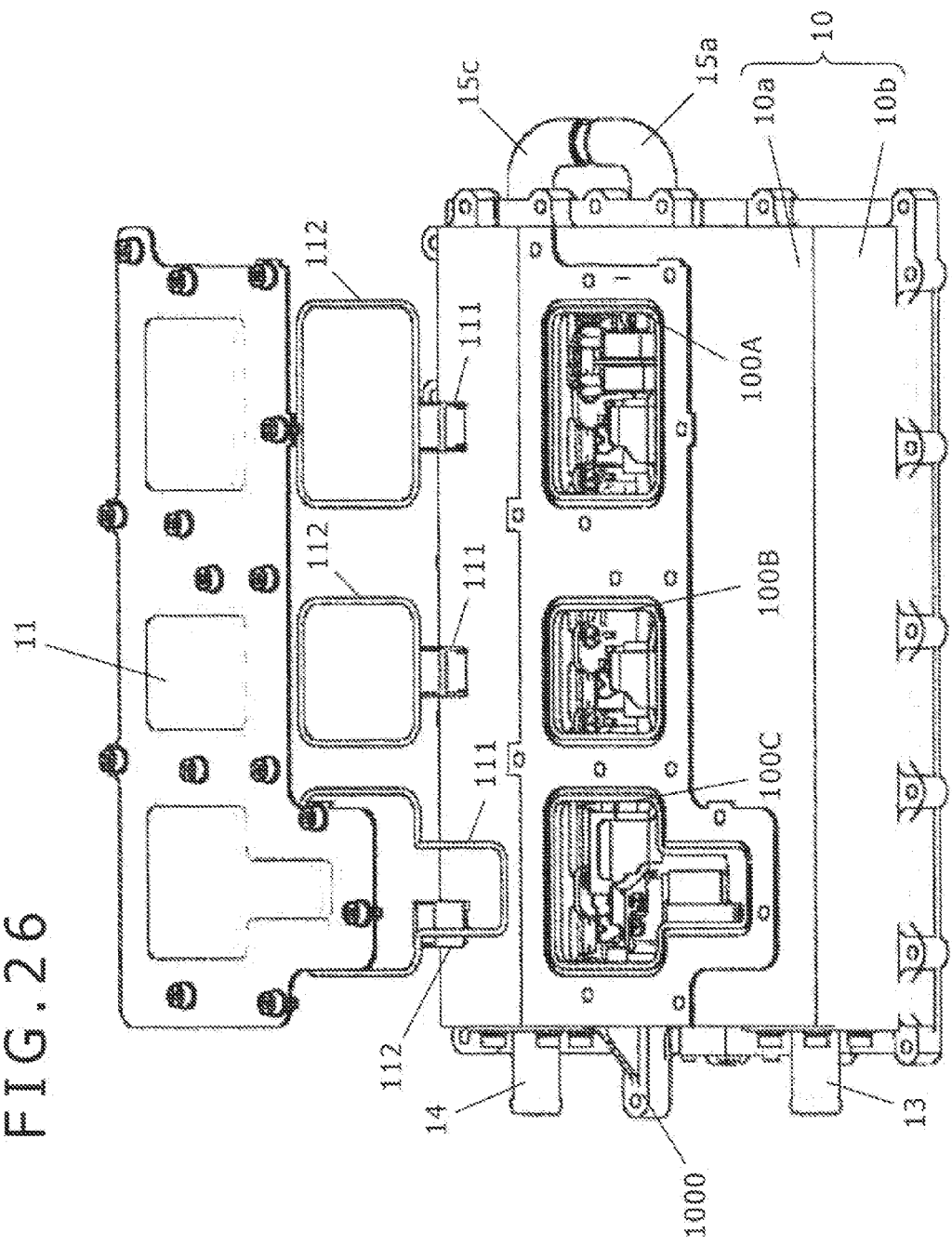
FIG. 26 is a perspective view showing the base side of the housing 10 to which the capacitor unit 4 and the power module unit 5 have been fixed.
Figure 27:
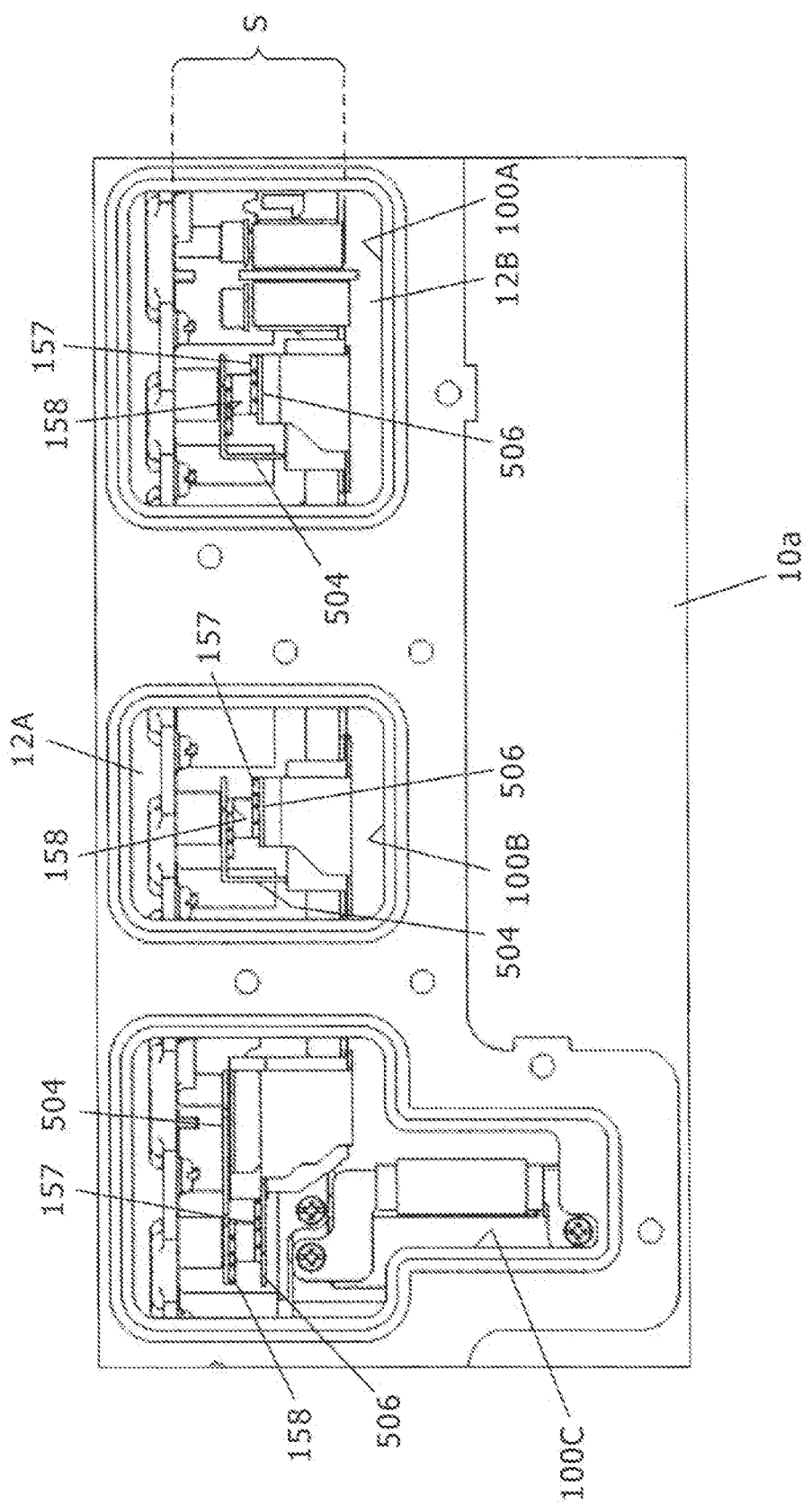
FIG. 27 is an enlarged view of the openings 100A-100C shown in FIG. 26.

FIG. 26 is a perspective view showing the base side of the housing 10 to which the capacitor unit 4 and the power module unit 5 have been fixed. FIG. 27 is an enlarged view of the openings 100A-100C shown in FIG. 26. After the fixation of the capacitor unit 4 and the power module unit 5 in the housing 10, the capacitor terminals 506 and 504 of the capacitor bus bar 501 of the capacitor unit 4 are respectively connected with the positive DC terminals 157 and the negative DC terminals 158 of the power semiconductor modules 300U-300W of the power module unit 5 by means of welding. Incidentally, the housing 10 is provided with a grounding portion to be connected with the grounding part of the vehicle. In this embodiment, the metallic housing 10 serves also as the grounding portion and the metallic housing 10 is mounted so that its base contacts the grounding part of the vehicle, for example. The grounding portion is provided depending on the position and the shape of the grounding part of the vehicle. For example, the grounding portion can be formed as a rib on the peripheral surface of the housing 10.

The capacitor terminals 506 and 504, the positive DC terminals 157 and the negative DC terminals 158 are extracted from the coolant channel bodies 12A and 12B toward the prescribed space S and are bent toward the housing base side in the middle. By the fixation of the capacitor unit 4 and the power module unit 5 in the housing 10, connecting portions of the negative capacitor terminals 504 and those of the negative DC terminals 158 are placed in the vicinity of each other and the positive capacitor terminals 506 and the positive DC terminals 157 are also placed in the vicinity of each other as shown in FIG. 27. Then, welding for connecting the negative capacitor terminals 504 with the negative DC terminals 158 and connecting the positive capacitor terminals 506 with the positive DC terminals 157 is performed by bringing a welding jig close to the terminals through the openings 100A-100C. Since the power conversion device of this embodiment is configured so that the capacitor terminals 506 and 504, the positive DC terminals 157 and the negative DC terminals 158 are arranged in the vicinity of the openings 100A-100C formed through the base 10a of the housing 10 as explained above, the welding operation from the housing base side can be performed with ease and the efficiency of the welding operation can be increased.

After the welding, insulation caps 112 are attached to the welded parts as shown in FIG. 26. Then, a lower cover 11 for covering the openings 100A-100C is fixed to the base 10a of the housing 10 by using bolts. A seal member 111 for the sealing is arranged between the lower cover 11 and the base of the housing.

Figure 28:
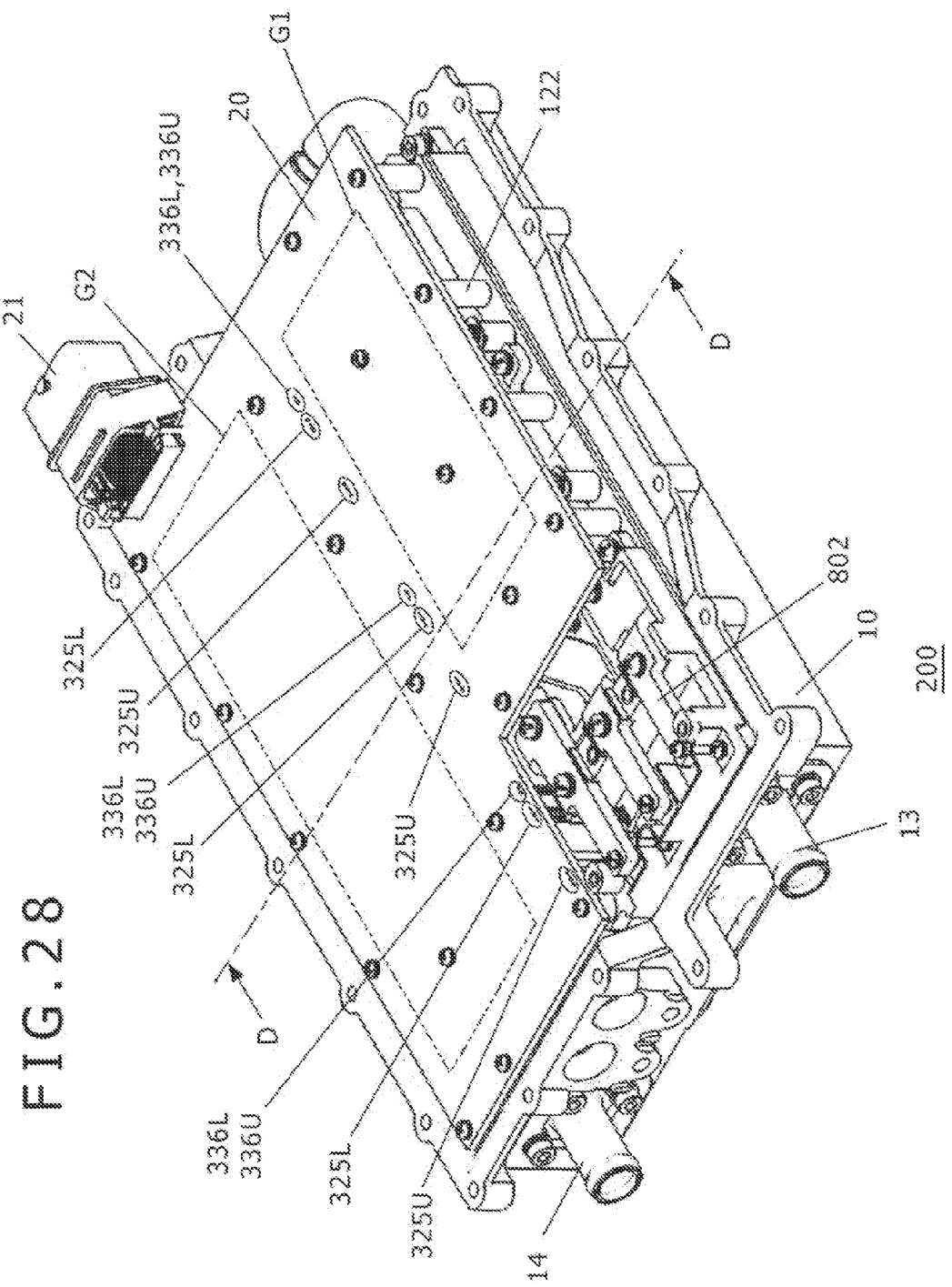
FIG. 28 is a perspective view showing a state after fixation of a circuit board 20 on the coolant channel bodies 12A and 12B.

On the other hand, on the opening side of the housing 10, the circuit board 20 is fixed on the pillars 122 and 124 formed on the coolant channel bodies 12A and 12B by using screws. FIG. 28 is a perspective view showing the state after the fixation of the circuit board 20 on the coolant channel bodies 12A and 12B. In the prescribed space S (see FIG. 5) formed between the coolant channel bodies 12A and 12B, the signal terminals 325U, 325L, 336U and 336L extend toward the housing opening. The mounting of the circuit board 20 on the pillars 122 and 124 is carried out so that the tip end parts of the signal terminals 325U, 325L, 336U and 336L penetrate through holes formed through the circuit board 20. Thereafter, the signal terminals 325U, 325L, 336U and 336L are soldered to the circuit board 20.

Figure 29:
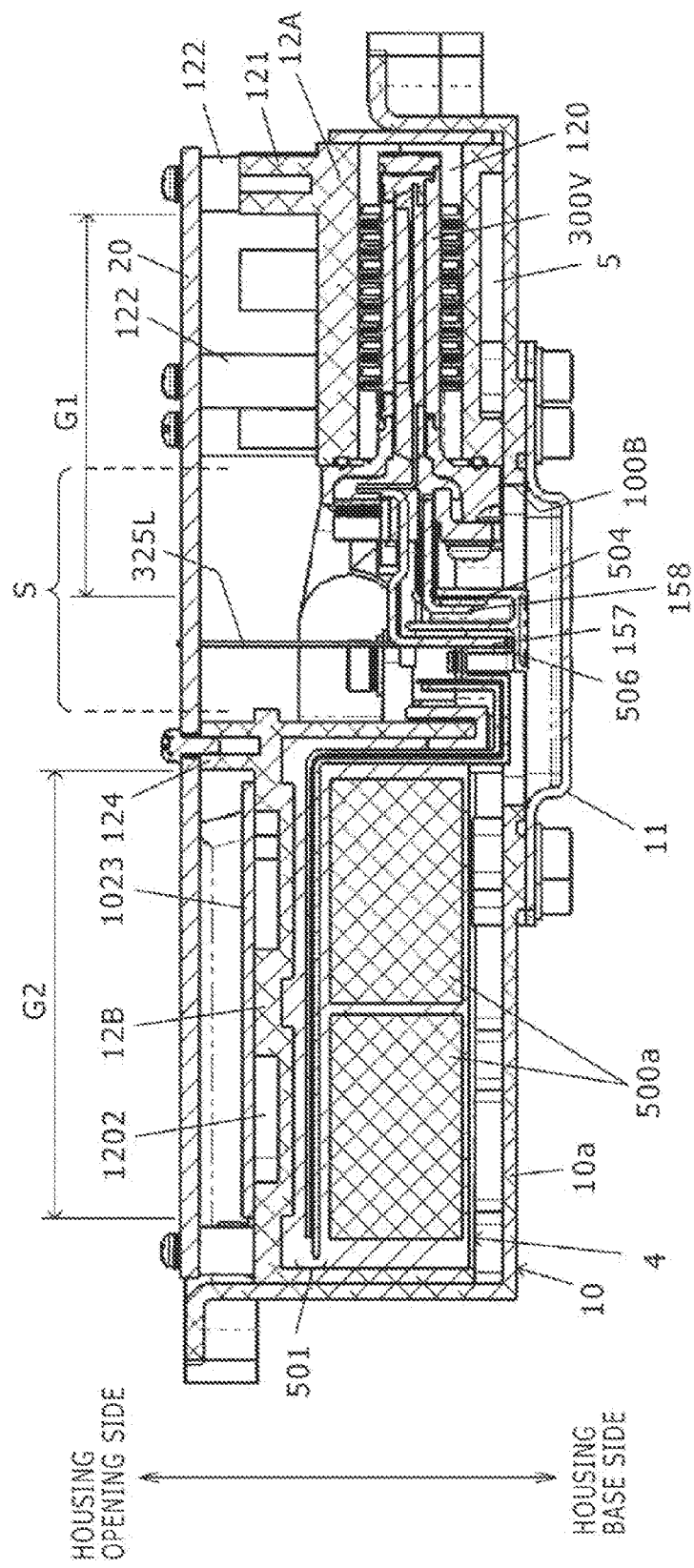
FIG. 29 is a cross-sectional view taken along the line D-D in FIG. 28.

FIG. 29 is a cross-sectional view taken along the line D-D in FIG. 28. The capacitor unit 4 has been stored on the left-hand side of the housing 10 in FIG. 29. The power module unit 5 has been stored on the right-hand side of the housing 10 in FIG. 29. The prescribed space S has been formed between the capacitor unit 4 and the power module unit 5. In the prescribed space S, the signal terminal 325L extends toward the housing opening side (upward in FIG. 29) and is connected to the circuit board 20. On the other hand, the capacitor terminals 504 and 506 of the capacitor bus bar 501 and the positive DC terminal 157 and the negative DC terminal 158 of the power semiconductor module 300V extend toward the housing base side and are welded via the opening 100B formed through the base 10a. The same goes for the power semiconductor modules 300U and 300W.

Electronic components of the control circuit 172 and the driver circuit 174 are mounted on the circuit board 20. In the example shown in FIGS. 28 and 29, the driver circuit 174 is mounted on a first area G1 of the circuit board 20 facing the AC bus bars 802U-802W, while the control circuit 172 is mounted on a second area G2 of the circuit board 20 facing the coolant channel body 12B.

As shown in FIG. 29, the second area G2 is closer than the first area G1 to the source of cooling (coolant), and thus the second area G2 excels the first area G1 in terms of cooling conditions. Since components radiating a lot of heat (e.g., transformer) are arranged in the driver circuit 174, it is desirable to arrange the control circuit 172 in the second area G2 and the driver circuit 174 in the first area G1 in consideration of the thermal effects on the components of the control circuit 172. With such an arrangement, the reliability of the circuit components can be increased.

Of course, even electronic components of the driver circuit 174 may also be arranged in the second area G2 having the higher cooling performance if the electronic components are weak in the heat resistance performance. Further, even electronic components of the control circuit 172 may also be arranged in the first area G1 if the electronic components have sufficient reserves in the heat resistance performance.

In the example of FIG. 28, a part of the circuit board 20 situated over the output part of the AC bus bar 802 is cut out. The shielding plate 50 is also not arranged for this part. This is because the current sensor module 180 is arranged in the output part as shown in FIG. 6. The AC bus bar 802 becomes a source of noise. The noise from the AC bus bar 802 can leak out from the cutout part of the circuit board 20 and affect signals flowing through the communication connector 21. Thus, the connector 21 in this embodiment is arranged at the diagonal position farthest from the cutout part so that the noise has no ill effect on the signals flowing through the communication connector 21.

(First Modification)

Figure 30:
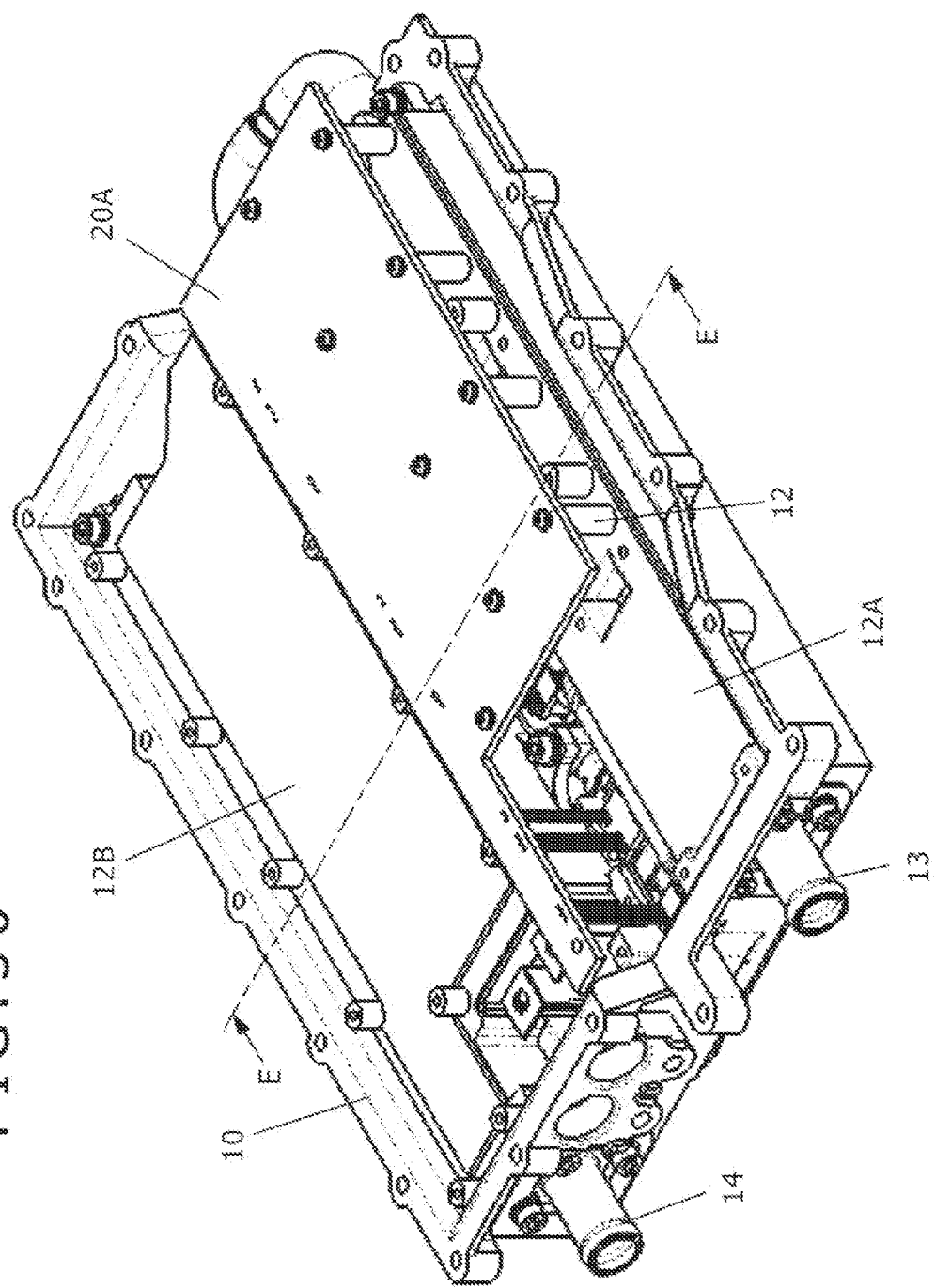
FIG. 30 is a perspective view for explaining a first modification of the power conversion device 200.
Figure 31:
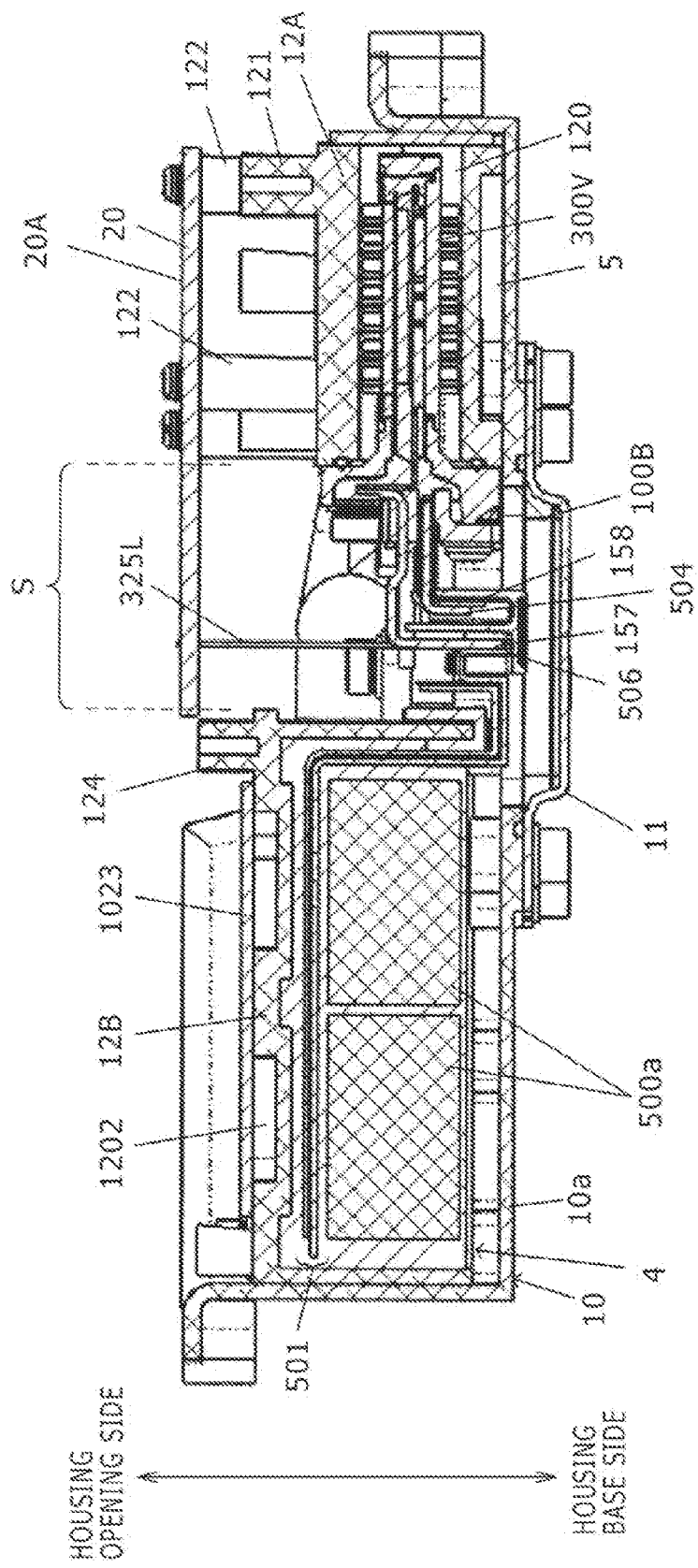
FIG. 31 is a cross-sectional view taken along the line E-E in FIG. 30.

FIGS. 30 and 31 are schematic diagrams for explaining a first modification (first modified example). Specifically, FIG. 30 is a perspective view of the power conversion device 200 according to the first modification and FIG. 31 is a cross-sectional view taken along the line E-E in FIG. 30. In FIGS. 30 and 31, illustration of the upper cover 3 and the bus bar holder 800 is omitted for clear understanding of the structure. While the circuit board 20 in the above embodiment was arranged to straddle both the capacitor unit 4 and the power module unit 5, a circuit board 20A in this first modification is arranged over the power module unit 5. While the control circuit 172 and the driver circuit 174 were mounted on the circuit board 20 as explained above, only the driver circuit 174 is mounted on the circuit board 20A.

The circuit board 20A is fixed on pillars 122 formed on the upper face (face on the housing opening side) of the coolant channel body 12A. Therefore, the circuit board 20A is cooled down by the coolant channel body 12A through which the coolant flows. The tip end parts of the signal terminals 325U, 325L, 336U and 336L extending toward the housing opening penetrate through holes formed through the circuit board 20A. Another circuit board on which the control circuit 172 has been mounted may be arranged separately in the housing 10 (e.g., over the coolant channel body 12B) or arranged in a housing (vehicle control side) other than the housing 10. Of course, it is also possible to mount both the control circuit 172 and the driver circuit 174 on the circuit board 20A.

(Second Modification)

Figure 32:
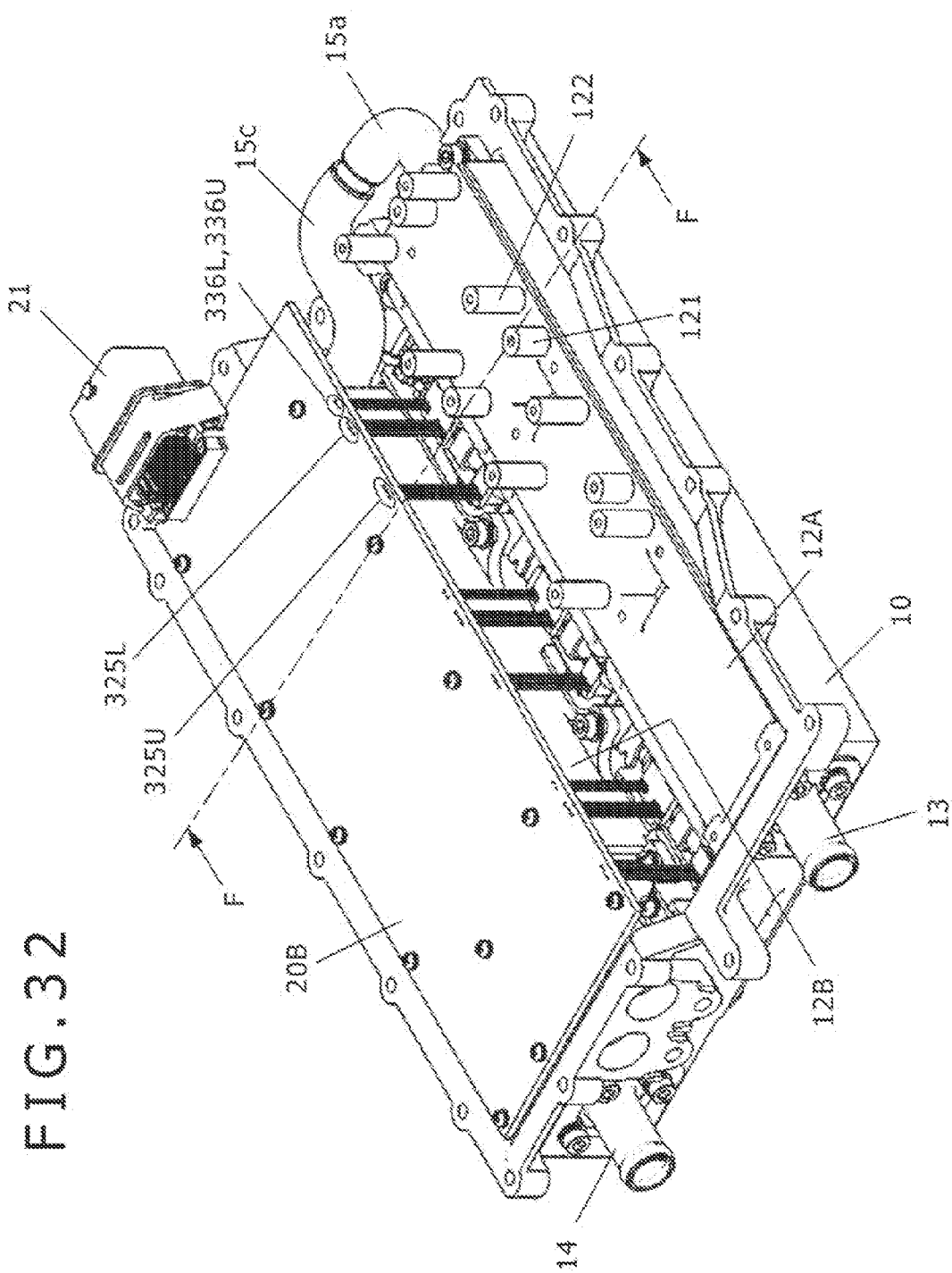
FIG. 32 is a perspective view for explaining a second modification of the power conversion device 200.
Figure 33:
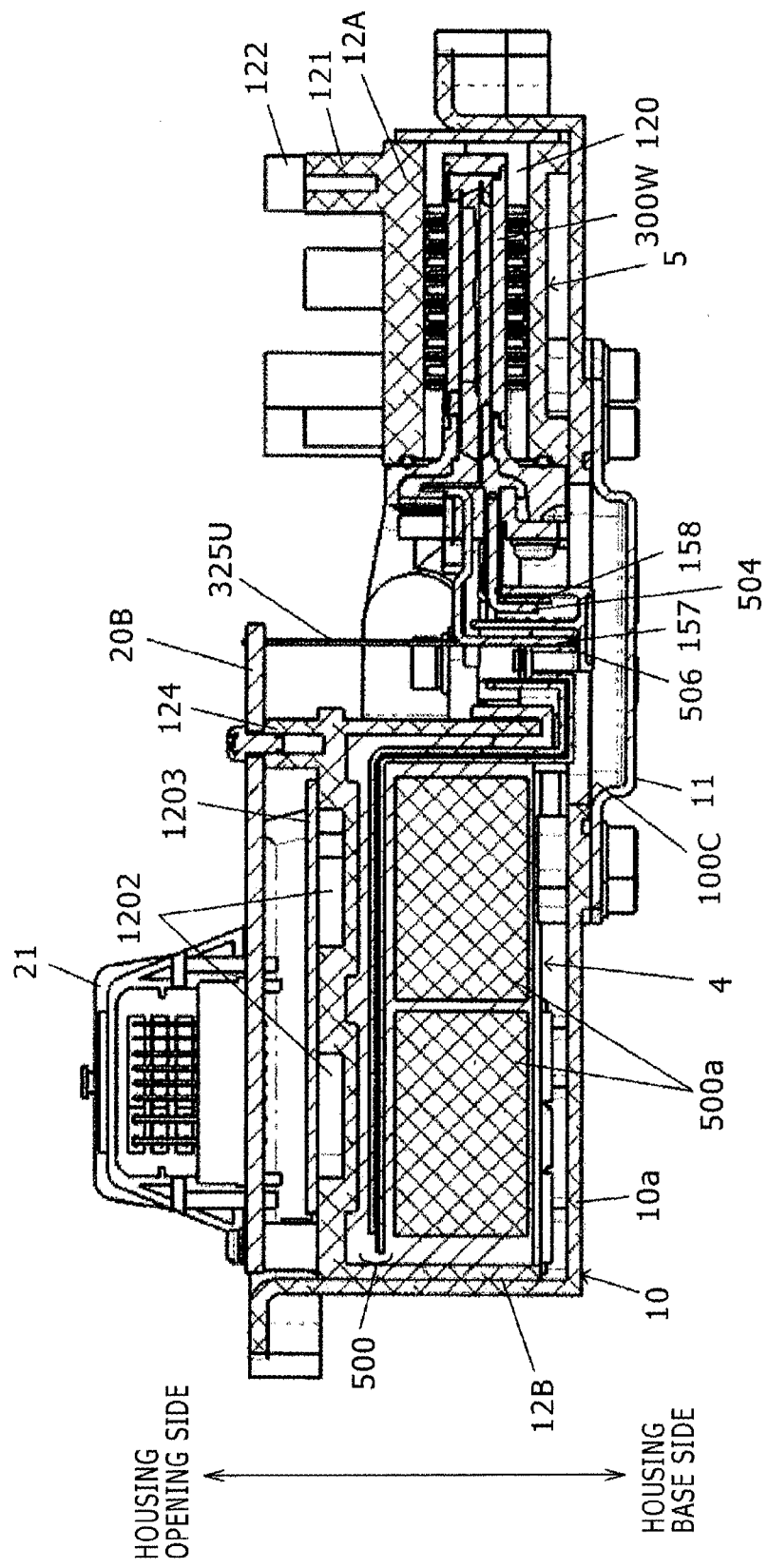
FIG. 33 is a cross-sectional view taken along the line F-F in FIG. 32.

FIGS. 32 and 33 are schematic diagrams for explaining a second modification. Specifically, FIG. 32 is a perspective view of the power conversion device 200 according to the second modification and FIG. 33 is a cross-sectional view taken along the line F-F in FIG. 32. In FIGS. 32 and 33, illustration of the upper cover 3 and the bus bar holder 800 is omitted for clear understanding of the structure. In this second modification, a circuit board 20B is arranged over the capacitor unit 4. The circuit board 20B is fixed on pillars 124 formed on the upper face of the coolant channel body 12B by using screws. The control circuit 172 and the driver circuit 174 are mounted on the circuit board 20B. The control circuit 172 is provided with a communication connector 21 for transmitting and receiving signals to/from the upper-level control device.

The tip end parts of the signal terminals 325U, 325L, 336U and 336L extending toward the housing opening penetrate through holes formed through the circuit board 20B. Since the circuit board 20B is arranged over and in the vicinity of the cover 1203 covering the coolant channel 1202 as shown in FIG. 33, the circuit board 20B is hardly affected by the heat from other heating components arranged in the housing 10 (e.g., the power semiconductor modules 300U-300W and the capacitor elements 500a). Further, the coolant channel body 12B is formed of metal such as aluminum and is in contact with the metallic housing 10 which is connected with the grounding part of the vehicle. Therefore, the coolant channel body 12B is kept at the ground potential, by which the ill effect of the noise (caused by the electric field, magnetic field, etc. occurring in the capacitor bus bar 501) on the circuit board 20B can be blocked.

Figure 34:
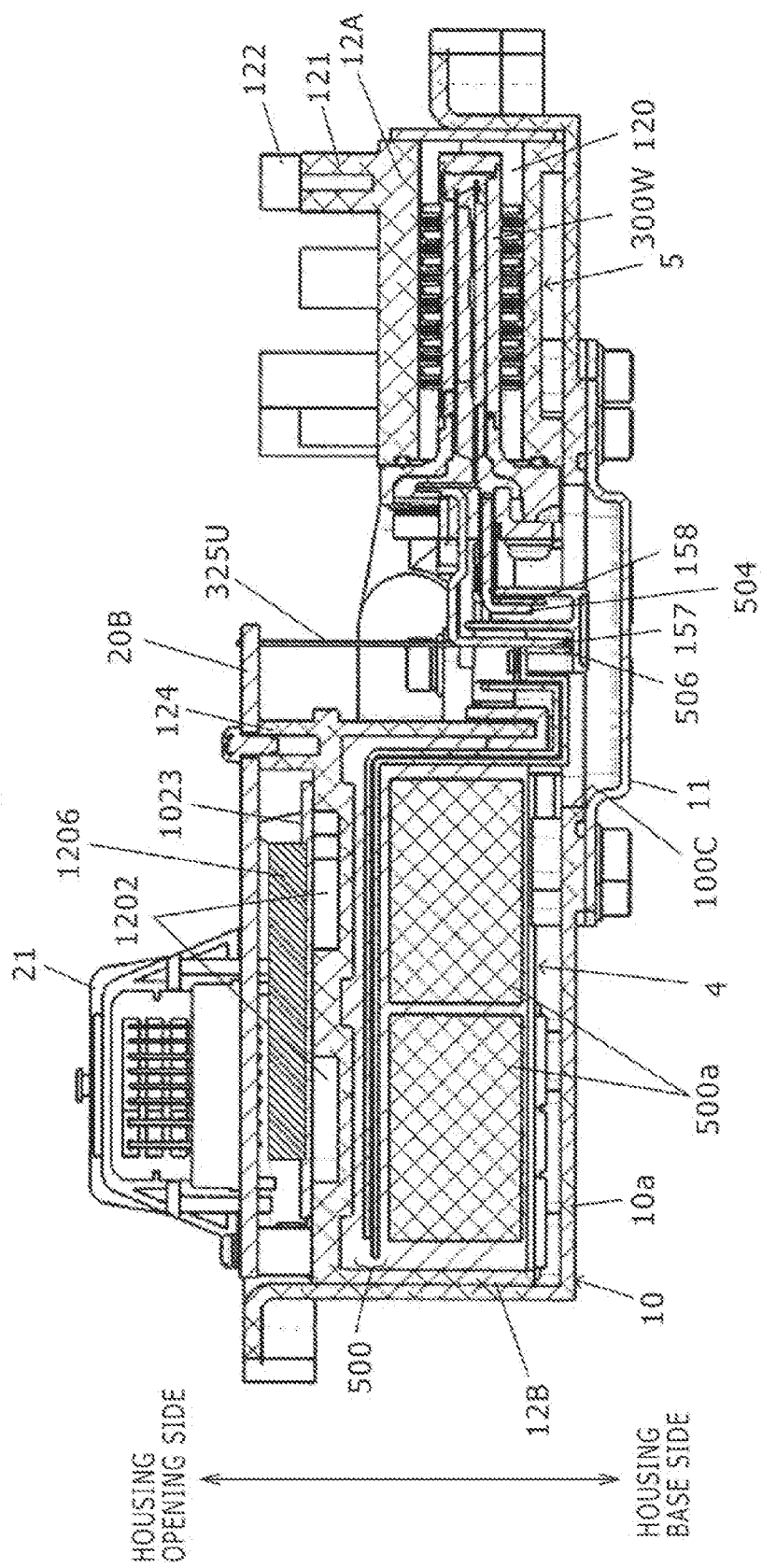
FIG. 34 is a cross-sectional view showing a case where a heat radiation sheet 1206 is arranged between a circuit board 20B and a cover 1203 of the coolant channel body 12B.

It is also possible to arrange a heat radiation sheet 1206 (e.g., silicone-based resin sheet) to be sandwiched between the circuit board 20B and the cover 1203 of the coolant channel body 12B as shown in FIG. 34. In the aforementioned configuration of FIG. 29, however, it is sufficient to arrange the heat radiation sheet 1206 between the second area G2 of the circuit board 20 and the cover 1203. In cases where no heat radiation sheet 1206 is arranged, the thermal insulation effect is relatively strong since air exists between the circuit board 20B and the cover 1203. Thus, the heat radiation from the circuit board 20B to the coolant is achieved mainly through the paths via the pillars 124 and the coolant channel body 12B. In contrast, by arranging the heat radiation sheet 1206 as shown in FIG. 34, the heat can be released to the coolant channel body 12B also via the heat radiation sheet 1206, by which the cooling performance for the circuit board 20B can be improved.

Also for the circuit board 20A shown in FIG. 31 and the first area G1 of the circuit board 20 shown in FIG. 29, the heat radiation sheet 1206 may be arranged between the circuit board 20A, 20 and the shielding plate 50 facing the circuit board. In this case, the heat on the circuit board is radiated to the coolant not only through the paths via the pillars 122 and the coolant channel body 12A but also through the paths via the heat radiation sheet 1206, the shielding plate 50, the pillars 121 and the coolant channel body 12A. Consequently, the cooling performance for the circuit board 20A and the first area G1 can be improved.

The following effects are achieved by the embodiments described above:

(1) The power conversion device 200 comprises:

a capacitor 500 which smoothes DC current;

power semiconductor modules 300U-300W in each of which power semiconductor devices (IGBTs 328 and 330 and diodes 156 and 166) for converting the DC current into AC current are stored in a module case 304 in a bottomed tubular shape and a positive DC terminal 157, a negative DC terminal 158, an AC terminal 159 and signal terminals 325U, 325L, 336U and 336L are extracted from an extracting part of the module case 304;

a capacitor bus bar 501 which connects the capacitor 500 with the positive DC terminals 157 and the negative DC terminals 158;

a coolant channel body 12A in which a coolant channel 120 is formed to allow the power semiconductor modules 300U-300W to be inserted therein;

a coolant channel body 12B in which a coolant channel 1202 for cooling the capacitor 500 and the capacitor bus bar 501 is formed; and a housing 10 having a base 10a on which the coolant channel bodies 12A and 12B are arranged in parallel across a prescribed space S and openings 100A-100C formed in areas of the base facing the prescribed space S.

The power semiconductor modules 300U-300W are inserted into the coolant channel 120 so that the extracting parts of the module cases 304 are arranged at the face of the coolant channel body 12A facing the prescribed space (i.e., the face through which the openings 120U-120W have been formed). The capacitor bus bar 501 is extracted from the coolant channel body 12B to the prescribed space S. The positive DC terminals 157 and the negative DC terminals 158 are connected with the capacitor bus bar 501 at positions facing the openings 100A-100C.

Since the coolant channel body 12A for cooling the power semiconductor modules 300U-300W and the coolant channel body 12B for cooling the capacitor 500 and the capacitor bus bar 501 are provided individually, the cooling performance can be improved.

Further, by the parallel arrangement of the coolant channel bodies 12A and 12B on the base 10a of the housing 10, the height dimension of the housing 10 (i.e., the height dimension of the power conversion device 200) can be reduced. Incidentally, since the power semiconductor modules 300U-300W are in flat shapes, the coolant channel body 12A is configured so that the power semiconductor modules 300U-300W are inserted into the coolant channel 120 through a side face of the coolant channel body 12A (i.e., the face facing the prescribed space S) as shown in FIG. 7. Therefore, the height dimension of the coolant channel body 12A can be made as low as possible.

Furthermore, the coolant channel bodies 12A and 12B are arranged in parallel across the prescribed space S and on both sides of the openings 100A-100C. The positive DC terminals 157 and the negative DC terminals 158 are connected with the capacitor bus bar 501 at the positions facing the openings 100A-100C. Therefore, the connecting work can be performed from the housing base side. Thus, the need of securing a work space for the connecting work on the side opposite to the base is eliminated, the other components can be arranged directly above the coolant channel bodies 12A and 12B, and the height dimension of the device can be reduced. As above, according to the above-described embodiments of the present invention, the height dimension (thickness dimension) of the power conversion device 200 can be reduced. Consequently, it becomes possible to provide power conversion devices that are suitable for arrangement in a small space like the one shown in FIG. 2.

Moreover, the prescribed space S is formed between the coolant channel bodies 12A and 12B, and the positive DC terminals 157, the negative DC terminals 158 and the capacitor bus bar 501 (the capacitor terminals 504 and 506) are extracted from the coolant channel bodies 12A and 12B to the prescribed space S for the connection. Therefore, the lengths of the conductors can be made as short as possible. Thanks to the reduction in the conductor resistance, the heating can be suppressed.

In addition, since the power semiconductor modules 300U-300W are arranged at the coolant channel 120 of the coolant channel body 12A, the heat generated in the power semiconductor modules can be released efficiently to the coolant. Meanwhile, since the concave part (accommodating portion 1201) is formed in the coolant channel body 12B having the coolant channel 1202 formed therein and the capacitor 500 and the capacitor bus bar 501 are stored in the accommodating portion 1201, the heat generated in the capacitor 500 and the capacitor bus bar 501 can be released to the coolant channel body 12B, by which the cooling performance for the capacitor 500 and the capacitor bus bar 501 can be improved.

The components of the power conversion device 200 are grouped into units corresponding to functions as shown in FIGS. 5, 7 and 16. Specifically, components on the DC side (the capacitor 500, the capacitor bus bar 501, the Y-capacitor 40, the discharge resistor 41, etc.) are mounted on the coolant channel body 12B to form the integrated capacitor unit 4. On the other hand, components related to the inverter circuit 140 (the power semiconductor modules 300U-300W, the AC bus bars 802U-802W, the current sensor module 180, etc.) are mounted on the coolant channel body 12A to form the integrated power module unit 5. Therefore, the assembly work and the reliability check (e.g., watertight test) of the units can be performed in parallel and the total work efficiency can be increased. Further, the replacement work is facilitated.

Incidentally, while the pipe 15c of the capacitor unit 4 and the pipe 15a of the power module unit 5 are connected together by using the pipe 15b in the above embodiments to circulate the coolant in the device in a pattern like "U", it is also possible to leave out the connection by the pipe 15b and make the coolant flow through the coolant channel bodies 12A and 12B in parallel, that is, make the coolant flow in through the inlet pipes 13 and 14 and flow out through the pipes 15a and 15c.

(2) The power conversion device 200 comprises a circuit board 20, 20A on which a driver circuit 174 for outputting a drive signal is mounted and which is arranged on a side of the coolant channel body 12A opposite to the base 10a so as to face the coolant channel body 12A. The power semiconductor modules 300U-300W have signal terminals 325L and 325U through which the drive signal for driving the power semiconductor devices (IGBTs 328 and 330) is inputted. The signal terminals 325L and 325U are extracted from the power semiconductor modules 300U-300W to the prescribed space S, extended toward the circuit board 20 in the prescribed space S, and connected to the circuit board 20.

Since the circuit board 20, 20A is arranged on a side of the coolant channel body 12A opposite to the openings 100A-100C (used for the connection of the positive DC terminals 157 and the negative DC terminals 158) and is connected to the signal terminals 325L and 325U as described above, interference between the signal terminals 325L and 325U's side and the positive and negative DC terminals 157 and 158's side in the connecting work (the work for connecting the signal terminals 325L and 325U and the work for connecting the positive and negative DC terminals 157 and 158) can be prevented.

Further, the prescribed space S is formed and the positive DC terminals 157, the negative DC terminals 158, the signal terminals 325L and 325U, and the capacitor bus bar 501 (the capacitor terminals 504 and 506) are extracted from the coolant channel bodies 12A and 12B to the prescribed space S. The positive DC terminals 157, the negative DC terminals 158, and the capacitor terminals 504 and 506 are extended toward the base having the openings 100A-100C, while the signal terminals 325L and 325U are extended toward the circuit board 20, 20A opposite to the base. Therefore, the positive DC terminals 157, the negative DC terminals 158, the signal terminals 325L and 325U, and the capacitor terminals 504 and 506 are prevented from greatly protruding from the width of the coolant channel bodies 12A and 12B in the height direction. Consequently, the dimension of the power conversion device 200 in the height direction can be reduced.

Incidentally, as shown in FIGS. 29 and 31, the signal terminals 325L and 325U extracted from the power semiconductor modules 300U-300W to the prescribed space S are bent in the middle substantially at the right angle and are connected substantially orthogonally to the through holes of the circuit board 20, 20A. Therefore, the work of inserting the signal terminals 325L and 325U into the through holes can be carried out with ease when the circuit board 20, 20A is attached to the pillars 122.

(3) The power conversion device 200 comprises a circuit board 20, 20B on which at least one of a control circuit 172 outputting a control signal for controlling the driving of the power semiconductor devices (the IGBTs 328 and 330) and a driver circuit 174 outputting a drive signal for driving the power semiconductor devices based on the control signal is mounted and which is arranged on a side of the coolant channel body 12B opposite to the base 10a so as to face the coolant channel body 12B. A concave part (accommodating portion 1201) for storing the capacitor 500 and the capacitor bus bar 501 is formed in the coolant channel body 12B so that the opening side of the concave part faces the base 10a of the housing 10.

Since the coolant channel body 12B having the coolant channel 1202 formed therein exists between the circuit board 20, 20A and the heating components (the capacitor 500 and the capacitor bus bar 501) as above, the heat generated in the capacitor 500 and the capacitor bus bar 501 is prevented from flowing into the circuit board 20, 20A.

The coolant channel bodies 12A and 12B are formed of metal such as aluminum. Further, the housing 10 (in which the coolant channel bodies 12A and 12B are arranged) is made of metal, connected to the grounding part of the vehicle, and thereby kept at the ground potential. Therefore, the coolant channel bodies 12A and 12B are also kept at the ground potential. Consequently, the ill effect of noise (caused by the electric field, magnetic field, etc. occurring in the capacitor bus bar 501) on the circuit board 20, 20A can be blocked by the coolant channel body 12B.

(4) It is also possible as shown in FIG. 34 to arrange a heat radiation sheet 1206 in close contact between the circuit board 20B and the coolant channel body 12B. By such an arrangement of the heat radiation sheet 1206, the heat generated in the circuit board 20B can be released to the coolant channel body 12B more efficiently compared to cases where no heat radiation sheet 1206 is arranged.

(5) In the power conversion device 200, the housing 10 is formed of metal to have a grounding portion (housing base). The coolant channel body 12A is formed of metal to have support parts (pillars 121) formed to protrude from a circumferential surface opposite to the base 10a. The power conversion device 200 comprises:

AC bus bars 802U-802W which are fixed to the circumferential surface of the coolant channel body 12A opposite to the base 10a and are connected to the power semiconductor modules 300U-300W for outputting the AC current to the outside of the device;

a circuit board 20, 20A on which at least one of a control circuit 172 outputting a control signal for controlling the driving of the power semiconductor devices (the IGBTs 328 and 330) and a driver circuit 174 outputting a drive signal for driving the power semiconductor devices based on the control signal is mounted and which is arranged at a position facing the AC bus bars 802U-802W; and a shielding plate 50 which is fixed to the pillars 121 to be arranged between the AC bus bars 802U-802W and the circuit board 20, 20A.

Since the coolant channel body 12A arranged in the housing 10 is formed of metal, the coolant channel body 12A remains at the ground potential similarly to the housing 10. Since the metallic shielding plate 50 fixed to the coolant channel body 12A is arranged between the AC bus bars 802U-802W and the circuit board 20, 20A, the ill effect of noise (caused by the electric field, magnetic field, etc. occurring in the AC bus bars 802U-802W) on the circuit board 20, 20A can be blocked by the shielding plate 50. Electric current caused in the shielding plate 50 by the noise flows to the ground via the coolant channel body 12A.

(6) The power conversion device 200 comprises:

AC bus bars 802U-802W which are fixed to a circumferential surface of the coolant channel body 12A opposite to the base 10a and are connected to the power semiconductor modules 300U-300W for outputting the AC current to the outside of the device; and a circuit board 20 on which a control circuit 172 outputting a control signal for controlling the driving of the power semiconductor devices (the IGBTs 328 and 330) and a driver circuit 174 outputting a drive signal for driving the power semiconductor devices based on the control signal are mounted and which is arranged on a side of the coolant channel bodies 12A and 12B opposite to the base 10a to face the AC bus bars 802U-802W and the coolant channel body 12B.

As shown in FIGS. 28 and 29, the driver circuit 174 is mounted on the first area G1 of the circuit board 20 facing the AC bus bars 802U-802W while the control circuit 172 is mounted on the second area G2 of the circuit board 20 facing the coolant channel body 12B. The second area G2 excels the first area G1 in terms of cooling conditions. Therefore, the reliability of the circuit components can be increased by arranging the control circuit 172 in the second area G2 and arranging the driver circuit 174 in the first area G1 as explained above.

(7) The capacitor bus bar 501 is arranged between the capacitor 500, which is stored in the accommodating portion 1201 formed as the concave part, and the wall surface of the concave part. Comparing the heating values (amounts of heat emission) of the capacitor 500 and the capacitor bus bar 501 stored in the accommodating portion 1201, the heating value of the capacitor bus bar 501 is greater. Therefore, arranging the capacitor bus bar 501 on the concave part wall surface's side as above makes it possible to preferentially cool down the capacitor bus bar 501.

The embodiments described above may be employed either individually or in combination since the effects of the embodiments can be achieved either individually or in a synergistic manner. The present invention is not to be restricted to the above embodiments; a variety of modifications, design changes, etc. to the embodiments are possible as long as the features of the present invention are not impaired. Other modes conceivable within the technical idea of the present invention are also contained within the scope of the present invention.

The disclosure of the following priority application is incorporated herein by reference:

Japanese Patent Application No. 2011-166987 (filed on Jul. 29, 2011)

The invention claimed is:

1. A power conversion device comprising:
   a capacitor which smoothes DC current;
   power semiconductor modules in each of which power semiconductor devices for converting the DC current into AC current are stored in a module case in a bottomed tubular shape and DC terminals, an AC terminal and signal terminals are extracted from an extracting part of the module case;
   a capacitor bus bar which connects the capacitor with the DC terminals;
   a first channel body in which a first coolant channel is formed to allow the power semiconductor modules to be inserted therein;
   a second channel body in which a second coolant channel for cooling the capacitor and the capacitor bus bar is formed; and
   a housing having a base on which the first and second channel bodies are arranged in parallel across a prescribed space and openings formed in areas of the base facing the prescribed space, wherein:
   the power semiconductor modules are inserted into the first coolant channel so that the extracting parts of the module cases are arranged at a face of the first channel body facing the prescribed space,
   the capacitor bus bar is extracted from the second channel body to the prescribed space, and
   the DC terminals are connected with the capacitor bus bar at positions facing the openings.

2. The power conversion device according to claim 1, wherein:
   the power semiconductor modules have the signal terminals through which a drive signal for driving the power semiconductor devices is inputted,
   the power conversion device further comprises a circuit board on which a drive circuit for outputting the drive signal is mounted and which is arranged on a side of the first channel body opposite to the base of the housing so as to face the first channel body, and
   the signal terminals extracted from the power semiconductor modules to the prescribed space are extended toward the circuit board in the prescribed space and connected to the circuit board.

3. The power conversion device according to claim 1, further comprising a circuit board on which either a control circuit or a drive circuit is mounted, the control circuit being arranged on a side of the second channel body opposite to the base of the housing so as to face the second channel body,
   wherein a concave part for storing the capacitor and the capacitor bus bar is formed in the second channel body so that an opening side of the concave part faces the base of the housing.

4. The power conversion device according to claim 3, further comprising a heat radiation sheet being in contact with the circuit board and the second channel body.

5. The power conversion device according to claim 1, wherein:
   the housing is formed of metal to have a grounding portion,
   the first channel body is formed of metal to have a support part formed to protrude from a circumferential surface opposite to the base of the housing, and
   the power conversion device further comprises:
   AC bus bars which are fixed to the circumferential surface of the first channel body opposite to the base and are connected to the power semiconductor modules for outputting the AC current to an outside of the power conversion device;
   a circuit board on which either a control circuit or a drive circuit is mounted, the drive circuit being arranged at a position facing the AC bus bars; and
   an electromagnetic shielding plate which is fixed to the support part to be arranged between the AC bus bars and the circuit board.

6. The power conversion device according to claim 1, further comprising:
   AC bus bars which are fixed to a circumferential surface of the first channel body opposite to the base of the housing and are connected to the power semiconductor modules for outputting the AC current to an outside of the power conversion device; and
   a circuit board on which a control circuit outputting a control signal for controlling a driving of the power semiconductor devices and a drive circuit outputting a drive signal for the driving of the power semiconductor devices based on the control signal are mounted and which is arranged on a side of the first and second channel bodies opposite to the base to face the AC bus bars and the second channel body, wherein:
   the drive circuit is mounted on a first area of the circuit board facing the AC bus bars, and
   the control circuit is mounted on a second area of the circuit board facing the second channel body.

7. The power conversion device according to claim 1, wherein the capacitor bus bar is arranged between the capacitor stored in a concave part of the second channel body and a wall surface of the concave part.

* * * * *